(12) United States Patent
Tanizaki et al.

(10) Patent No.: US 6,762,953 B2
(45) Date of Patent: Jul. 13, 2004

(54) NONVOLATILE MEMORY DEVICE WITH SENSE AMPLIFIER SECURING READING MARGIN

(75) Inventors: Hiroaki Tanizaki, Hyogo (JP); Hideto Hidaka, Hyogo (JP); Tsukasa Ooishi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/455,479

(22) Filed: Jun. 6, 2003

(65) Prior Publication Data

US 2004/0095825 A1 May 20, 2004

(30) Foreign Application Priority Data

Nov. 14, 2002 (JP) ........................................ 2002-330912

(51) Int. Cl.[7] .............................. G11C 11/00; G11C 7/00
(52) U.S. Cl. ..................... 365/158; 365/189.09; 365/207
(58) Field of Search ................................ 365/158, 171, 365/173, 189.09, 207

(56) References Cited

U.S. PATENT DOCUMENTS

| 6,191,989 B1 | * | 2/2001 | Luk et al. ................... 365/207 |
| 6,504,752 B2 | * | 1/2003 | Ito ............................... 365/158 |
| 6,590,804 B1 | * | 7/2003 | Perner ......................... 365/158 |
| 6,597,601 B2 | * | 7/2003 | Ooishi ......................... 365/171 |
| 6,600,690 B1 | * | 7/2003 | Nahas et al. ................. 365/158 |
| 6,608,776 B2 | * | 8/2003 | Hidaka ........................ 365/171 |
| 6,621,729 B1 | * | 9/2003 | Garni et al. ................. 365/207 |
| 6,657,889 B1 | * | 12/2003 | Subramanian et al. ....... 365/158 |
| 6,678,189 B2 | * | 1/2004 | Tran ............................ 365/171 |

FOREIGN PATENT DOCUMENTS

JP 6-309883 11/1994

OTHER PUBLICATIONS

"Ultra LSI Memory", Kiyoo ITO, Advanced Electronics Series, I–9, Baifukan, Nov. 5, 1994, pp. 22–29, 166–175, 188–189 and 378 (partial English translation).

"A 40ns 64Mb DRAM with Current–Sensing Data–Bus Amplifier", Masao Taguchi et al., IEEE ISSCC TAM6.5, Feb. 14, 1991.

"A 10ns Read and Write Non–Volatile Memory Array Using a Magnetic Tunnel Junction and FET Switch in Each Cell", Scheuerlein et al., IEEE ISSCC Digest of Technical Papers, TA7.2, Feb. 8, 2000.

"Forefront of Non–Volatile Memory/The Future in Intel's Mind: From Flash Memory to OUM", Nikkei Microdevices, Mar., 2002, pp. 65–78 (partial English translation).

* cited by examiner

*Primary Examiner*—Trong Phan
(74) *Attorney, Agent, or Firm*—McDermott, Will & Emery

(57) ABSTRACT

In a sense amplifier, local I/O lines are maintained at a predetermined voltage by transistors. Transistors forming a current mirror supply an operating current according to a passing current which flows through transistors, to sense nodes. Transistors forming a current mirror extract an operating current according to the passing current which flows through transistors, from sense nodes. As a result, a voltage difference is generated in sense nodes in accordance with the operating current difference.

12 Claims, 18 Drawing Sheets

SMALL PASSING CURRENT

LARGE PASSING CURRENT

NONVOLATILE MEMORY DEVICE WITH SENSE AMPLIFIER SECURING READING MARGIN

BACKGROUND OF THE INVENTION

1. Field of the Invention

The present invention relates to a nonvolatile memory device, and more particularly to a circuit configuration of a sense amplifier which amplifies storage data in a memory cell.

2. Description of the Background Art

In recent years, a nonvolatile memory device enabling nonvolatile data storage is becoming mainstream. An example thereof includes a flash memory enabling high integration. Further, special attention is being given, as nonvolatile memory devices for the new generation, to an MRAM (Magnetic Random Access Memory) device for performing nonvolatile data storage with a thin film magnetic element, and an OUM(R) (Ovonic Unified Memories) device for performing data storage with a thin film material called chalcogenide.

Data stored in a memory cell used as a storage element of these nonvolatile memory devices is generally read by applying a predetermined voltage on the storage element and detecting a passing current at the moment. The data reading requires securing reading margin by increasing the amount of passing current; however, applying too much voltage may make it impossible to perform data reading.

For example, when a high voltage is applied to a tunneling magneto-resistance element (hereinafter, also referred to as a TMR element) which is a storage element of an MRAM device, there arises a problem in that the thin insulating film forming the TMR element is broken.

When a high voltage is applied to a chalcogenide layer used as a storage element of an OUM(R) device, there arises a problem in that the element is deformed, whereby the stored data is broken.

In addition, in a flash memory which performs data storage according to the level of a threshold voltage, when the amount of passing current which flows through the flash memory is increased too much by applying a high voltage, there arises a problem in that erroneous writing is caused, whereby stored data is broken. Therefore, it is necessary to carefully control the voltage applied to the memory cell. Japanese Patent Laying-Open No. 6-309883 discloses a configuration of performing data reading in accordance with the comparison of the voltage difference between a voltage obtained from resistance division into the electric resistance of the memory cell and the predetermined fixed resistance, and a reference voltage. In other words, it discloses a configuration of performing data reading by controlling the voltage to be applied to the memory cell by means of resistance division with fixed resistance.

However, in this configuration, it is necessary to set the operating voltage of a circuit at a comparatively high level in order to secure the difference with the reference voltage, that is, to secure data reading margin. Therefore, it is difficult to secure data reading margin with a low operating voltage.

SUMMARY OF THE INVENTION

An object of the present invention is to provide a nonvolatile memory device capable of securing sufficient reading margin under a comparatively low operating voltage and performing stable data reading.

A nonvolatile memory device according to the present invention includes a plurality of memory cells through which a passing current flows according to stored data at the time of data reading, a first and second data lines, a differential amplifying unit, and a reference voltage supply unit. The differential amplifying unit performs data reading in accordance with a passing current difference between the first and second data lines. The reference voltage supply unit generates a passing current to be used to compare with a selected memory cell out of the plurality of memory cells in one of the first and second data lines at the time of the data reading. At the time of the data reading, one of the first and second data lines is electrically connected to a first voltage trough the selected memory cell, and the other of the first and second data lines is electrically connected to the reference current supply unit. The differential amplifying unit includes a first and a second current mirror circuit, and an amplifying unit. The first current mirror circuit is arranged between the one data line and a second voltage so as to maintain the voltage of the one data line at a predetermined level at the time of the data reading, and also to supply a first mirror current according to the passing current of the one data line, to a first internal node. The second current mirror circuit is arranged between the other data line and the second voltage so as to maintain the voltage of the other data line at the predetermined level at the time of the data reading, and also to supply a second mirror current according to the passing current of the other data line to a second internal node. The amplifying unit outputs read data according to the difference between the mirror currents to be supplied to the first and second internal nodes.

According to the present invention, as described above, the differential amplifying unit adjusts the voltages of the first and second data lines by the first and second current mirror circuits. The first and second current mirror circuits supply mirror currents according to the passing currents which flow through the first and second data lines to the first and second internal nodes, and the amplifying unit outputs read data according to the mirror current difference. With the configuration, adjusting the voltage to be applied to the selected memory cell which is connected to one of the first and second data lines makes it possible to perform stable data reading and also perform a data read operation based on a small amount of passing current. It is therefore possible to operate at a low voltage and to reduce power consumption of the differential amplifying unit.

Further, a nonvolatile memory device according to the present invention includes a plurality of memory cells arranged in a matrix through which a passing current flows according to stored data at the time of data reading, a plurality of bit lines provided in correspondence with memory cell columns, respectively, X (X: an integer of equal to or more than 2) data lines, a reference data line used to compare with a selected memory cell out of the plurality of memory cells at the time of data reading, a reference current supply unit, X differential amplifying units, a plurality of column selection lines provided in correspondence with the plurality of groups, respectively, and a plurality of connection control units. The reference current supply unit generates a predetermined passing current to the reference data line at the time of the data reading. The X differential amplifying units are provided in correspondence with the X data lines, respectively so as to perform data reading according to the difference between the passing currents which flow through the corresponding data lines and the reference data line. The plurality of bit lines are divided into a plurality of groups each having X bit lines at the time of the data reading. The plurality of connection control units are provided in correspondence with the plurality of groups, respectively so as to electrically couple X bit lines belonging to the corresponding group to the X data lines, in response to the activation of the corresponding column selection line at the time of the data reading. At the time of the data reading, at least one of the X bit lines is electrically connected to a first voltage through the selected memory cell. Each of the X differential amplifying units includes a current mirror circuit and an amplifying unit. The current mirror circuit is arranged between the corresponding data line and a second voltage so as to maintain the voltage of the corresponding data line at a predetermined level at the time of the data reading, and also to supply a mirror current according to the passing current of the corresponding data line to an internal node. The amplifying unit outputs read data according to the current difference between the passing current which flows through the reference data line and the mirror current to be supplied to the internal node, at the time of data reading.

According to the present invention, X data lines are provided and a plurality of bit lines are divided into groups each consisting of X bit lines. Further, X connection control circuits are provided for electrically coupling the X bit lines in each group to the X data lines at the time of data reading, and the X connection control circuits are each provided with X differential amplification units which perform data reading in accordance with the difference in passing current between each data line and the reference current at the time of data reading. It is therefore possible to realize X-bit data reading from the X bit lines in one data read operation, and to perform efficient data reading.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
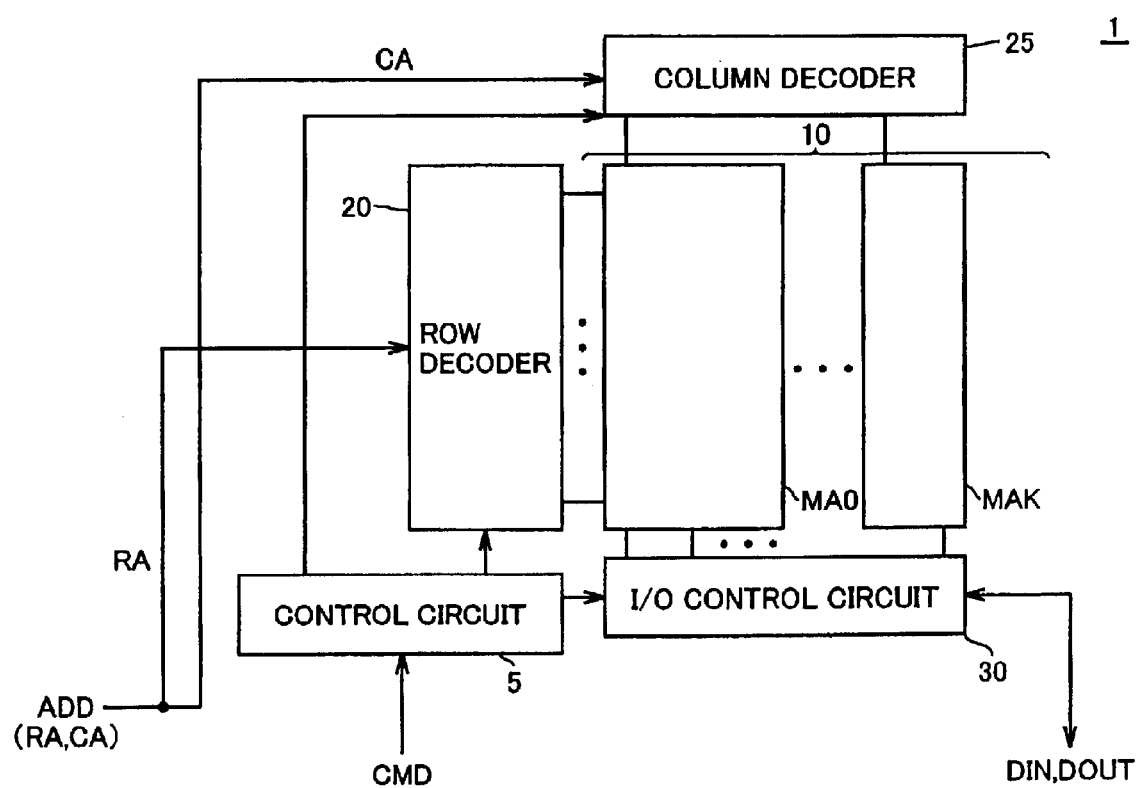
FIG. 1 is a schematic block diagram showing an entire configuration of an MRAM device as an example of a nonvolatile memory device according to a first embodiment of the present invention.

Embodiments of the present invention will be specifically described with reference to the drawings. The same or equivalent components in the figures are denoted with the same reference numerals, and none of the description will be therefore repeated.

First Embodiment

With reference to FIG. 1, a MRAM device 1, which is shown as a representative example of a nonvolatile memory device according to the embodiments of the present invention, includes: a control circuit 5 which controls an entire operation of MRAM device 1 in response to a control signal CMD; and a memory bank 10 which has a plurality of memory arrays MA each including MTJ memory cells MC arranged in a matrix. Memory bank 10 includes memory arrays MA0 to MAk (k: a natural number), and memory arrays MA generally represent each memory array.

As will be apparent from the following description, the present invention can be applied not only to an MRAM device provided with an MTJ memory cell, but also to any nonvolatile memory device provided with a memory cell through which a passing current flows according to the level of the written storage data.

Herein, the rows and the columns of the plurality of memory cells MC integrally arranged in the matrix in each of memory arrays MA will be also referred to as memory cell rows and memory cell columns, respectively.

MRAM device 1 includes a row decoder 20, a column decoder 25 and an I/O control circuit 30. Row decoder 20 performs row selection in memory arrays MA which is to be the access target selectively, on the basis of row address RA included in an address signal ADD. Column decoder 25 performs column selection in memory arrays MA which is to be the access target selectively, on the basis of column address CA included in address signal ADD.

I/O control circuit 30 controls the input and output of data such as input data DIN and output data DOUT so as to transmit input data DIN to internal circuits in response to an instruction of control circuit 5 or so as to output output data DOUT to outside.

In the following description, the binary high-voltage state and low-voltage state in signals, signal lines, data and the like will be also referred to as "H" level and "L" level, respectively.

Figure 2:
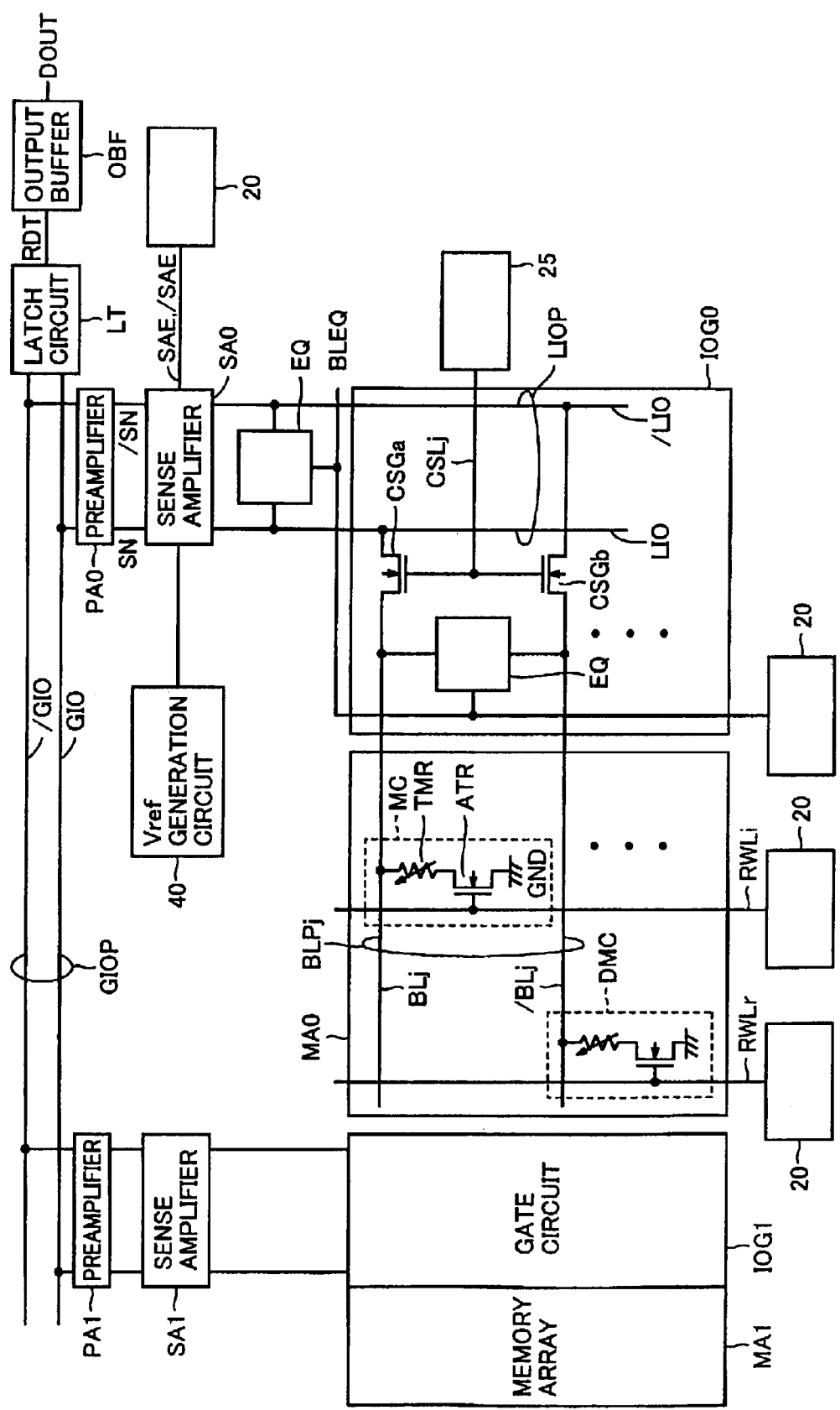
FIG. 2 is a conceptual diagram of a memory array and peripheral circuits which perform data reading from the memory array.

With reference to FIG. 2, memory arrays MA and the peripheral circuits for performing data reading in memory arrays MA (hereinafter, also referred to as data reading circuits) will be described.

FIG. 2 shows a group of circuits for data read operation which are provided in correspondence with memory arrays MA0 and MA1 included in I/O control circuit 30. A group of circuits for data read operation in memory array MA0 will be described as an example.

Memory array MA0 has memory cells MC integrally arranged in the matrix and a plurality of dummy memory cells DMC provided to compare with memory cells MC. Memory arrays MA are provided with bit line pairs BLP in correspondence with two adjacent memory cell columns. Bit line pairs BLP include bit lines BL and complementary bit lines /BL provided in correspondence with the memory cell columns. The plurality of dummy memory cells DMC are aligned so as to share the memory cell columns. In FIG. 2, memory cell MC provided in correspondence with bit line BLj and dummy memory cell DMC provided in correspondence with bit line /BLj are shown representatively out of j-th bit line pairs BLj.

This configuration enables efficient arrangement of the dummy memory cells, thereby reducing the area of the memory array.

A plurality of word lines RWL are provided in correspondence with the memory cell rows, respectively. The present embodiment shows a word line RWLi (i: a natural number) provided in correspondence with memory cell MC and a word line RWLr (r: a natural number) provided in correspondence with dummy memory cell DMC. In addition, digit lines (not shown) are provided in correspondence with the memory cell rows, respectively, in order to supply memory cells MC with a data writing current which performs data writing.

A plurality of column selection lines are also provided in correspondence with bit line pairs BLP, respectively, so as to transmit a column selection instruction from column decoder 25.

FIG. 2 shows a column selection line CSLj provided in correspondence with j-th bit line pair BLPj in memory array MA0.

Herein, the circuit configuration of memory cells MC will be described.

Figure 3:
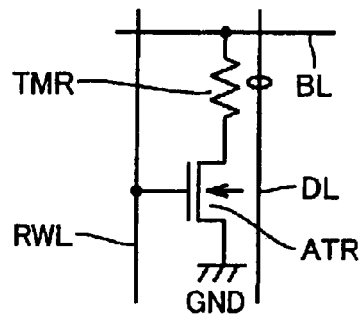
FIG. 3 is a schematic diagram showing a configuration of an MTJ memory cell having a magnetic tunnel junction unit.

With reference to FIG. 3, MTJ memory cells (hereinafter, also simply referred to as memory cells MC) having a magnetic tunnel junction unit include a tunneling magneto-resistance element TMR whose electric resistance changes according to the level of the data written magnetically and an access transistor ATR. Access transistor ATR is connected in series to a tunneling magneto-resistance element TMR between a bit line BL and a ground voltage GND. The typical example of access transistor ATR is a field-effect transistor formed on a semiconductor substrate.

Memory cells MC are provided with bit lines BL and digit lines DL which flow a data wiring current in different directions at the time of data writing, and word lines RWL to be activated at the time of data reading. At the time of data reading, tunneling magneto-resistance element TMR is electrically coupled between ground voltage GND and bit line BL in response to the tuning on of access transistor ATR.

Herein, the configuration and the data storage principle of MTJ memory cells will be described.

Figure 4:
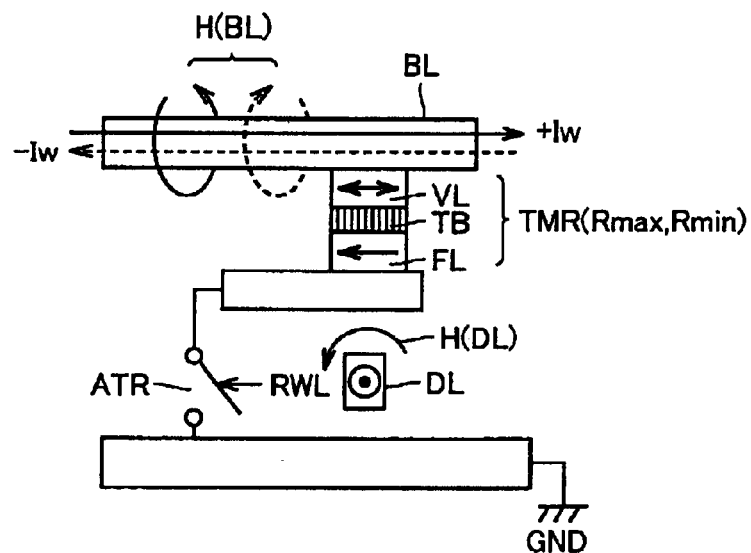
FIG. 4 is a conceptual diagram for describing a configuration and data storage principle of the MTJ memory cell.

With reference to FIG. 4, tunneling magneto-resistance element TMR has a ferromagnetic material layer FL having a fixed magnetic direction (hereinafter, simply referred to as "fixed magnetic layer") and a ferromagnetic material layer capable of being magnetized in the direction according to the magnetic field applied from outside (hereinafter, simply referred to as "free magnetic layer"). Provided between fixed magnetic layer FL and free magnetic layer VL is a tunneling barrier (tunneling film) TB formed from an insulating film. Free magnetic layer VL is magnetized in the direction the same as or opposite to fixed magnetic layer FL according to the level of the data to be written. Fixed magnetic layer FL, tunneling barrier TB and free magnetic layer VL form a magnetic tunnel junction.

The electric resistance of tunneling magneto-resistance element TMR is changed according to the correlation in the magnetic directions between fixed magnetic layer FL and free magnetic layer VL. To be more specific, the electric resistance of tunneling magneto-resistance element TMR has a minimum value Rmin when fixed magnetizing layer FL and free magnetic layer VL are the same (parallel) in the magnetic direction, and has a maximum value Rmax when both layers are opposite (anti-parallel) in the magnetic direction.

At the time of data writing, word line RWL is inactivated, and access transistor ATR is turned off. Under this state, the data writing current for magnetizing free magnetic layer VL is flown in the direction according to the level of the written data in each of bit line BL and digit line DL. To be more specific, bit line BL is supplied with a current ($\pm$Iw) to generate a magnetic field H (BL). Also, a magnetic field H (DL) is generated by the current flowing into digit line DL.

Figure 5:
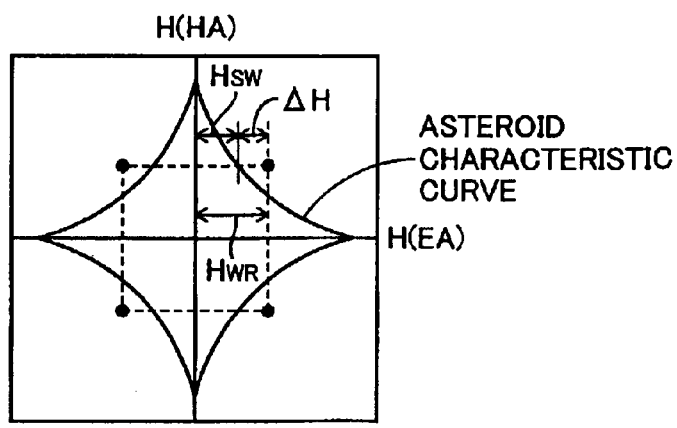
FIG. 5 is a conceptual diagram showing the relationship between the supply of data writing current to the MTJ memory cell and a magnetic direction of a tunneling magneto-resistance element.

With reference to FIG. 5, the relationship between the supply of the data writing current to MTJ memory cells and the magnetic direction of the tunneling magneto-resistance element will be described.

With reference to FIG. 5, a horizontal axis H (EA) indicates a magnetic field to be applied in EA (Easy Axis) in free magnetic layer VL within tunneling magneto-resistance element TMR. On the other hand, a vertical axis H (HA) indicates a magnetic field which effects in the direction of HA (Hard Axis) in free magnetic layer VL. Magnetic fields H (EA) and H (HA) respectively correspond to the two magnetic fields generated by the electric currents flowing through bit line BL and digit line DL, respectively.

In MTJ memory cell, the fixed magnetic direction of fixed magnetic layer FL goes along EA of free magnetic layer VL, and free magnetic layer VL is magnetized in the direction parallel or anti-parallel (opposite) to fixed magnetic layer FL in the direction of EA. MTJ memory cells can store 1-bit data in correspondence with the two magnetic directions of free magnetic layer VL.

The magnetic direction of free magnetic layer VL can be newly rewritten only when the sum of magnetic fields H (EA) and H (HA) to be applied reaches the region outside the asteroid characteristic curve shown in FIG. 5. In other words, when the applied data wiring magnetic fields have a strength corresponding to the region inside the asteroid characteristic curve, the magnetic direction of free magnetic layer VL never changes.

As is shown by the asteroid characteristic curve, applying a magnetic field in HA direction with respect to free magnetic layer VL makes it possible to decrease a magnetic threshold necessary to change the magnetic direction which is along EA. As shown in FIG. 5, the operating point at the time of data writing is designed so as to rewrite the storage data of MTJ memory cell, that is, the magnetic direction of tunneling magneto-resistance element TMR when the predetermined data writing current is flown into both of digit line DL and bit line BL.

At the operating point shown in FIG. 5, the data writing magnetic field in EA direction is designed so as to have intensity $H_{WR}$ in MTJ memory cell as the data writing target. In other words, the value of the data writing current flown into bit line BL or digit line DL is designed so as to obtain the data writing magnetic field $H_{WR}$. In general, the data writing magnetic field $H_{WR}$ is expressed by the sum of switching magnetic field $H_{SW}$ necessary for switching the magnetic direction and margin $\Delta H$. In short, $H_{WR}=H_{SW}+\Delta H$.

The magnetic direction which is written in tunneling magneto-resistance element TMR, that is, the storage data of MTJ memory cell is retained in a nonvolatile manner until new data writing is performed. The electric resistance of each memory cell is, strictly speaking, the sum of the on resistances of tunneling magneto-resistance element TAM and access transistor ATR and the other parasitic resistances; however, the resistances other than that of tunneling magneto-resistance element TMR are fixed regardless of the storage data. Therefore, in the following description, the electric resistances of the two kinds of normal memory cells according to the storage data can be expressed in Rmax and Rmin, and the difference between them is expressed as $\Delta R$ (i.e., $\Delta R=Rmax-Rmin$).

Each of dummy memory cells DMC arranged in memory arrays MA shown in FIG. 2 is fixedly set at an intermediate electric resistance value between electric resistances Rmax and Rmin written in advance. Since the present invention mainly describes a data read operation, digit lines DL and the like used for data writing are not shown.

With reference to FIG. 2 again, I/O control circuit 30 includes local I/O line pairs LIOP and gate circuits IOG controlling electric connection between local I/O line pairs LIOP and bit line pairs BLP, which are provided in each of memory arrays MA. Local I/O line pairs LIOP have local I/O lines LIO and /LIO. In the present embodiment, gate circuits IOG0 and IOG1 provided in correspondence with memory arrays MA0 and MA1 are shown.

Gate circuits IOG include gate transistors CSGa and CSGb which electrically connect local I/O line pairs LIOP and bit line pairs BLP in response to a column selection instruction of the column decoder. Gate transistor CSGa electrically connects bit lines BL and local I/O lines LIO in response to the activation of column selection lines CSL provided in correspondence with bit line pairs BLP, respectively. Gate transistor CSGb electrically connects complementary bit lines /BL and local I/O lines /LIO in response to the activation of column selection line CSL.

I/O control circuit 30 further includes sense amplifiers SA which detect reading data according to the difference in passing currents between local input/output lines LIO and /LIO, and preamplifiers PA which further amplify the storage data of selected memory cells detected by sense amplifiers SA. The present embodiment shows a sense amplifier SA0 and a preamplifier PA0 provided in correspondence with memory array MA0, and a sense amplifier SA1 and a preamplifier PA1 provided in correspondence with memory array MA1.

I/O control circuit 30 includes: global I/O line pairs GIOP provided commonly to each of memory arrays MA; a latch circuit LT which is connected with global I/O line pairs GIOP and latches storage data; and an output buffer OBF which outputs read data RDT latched by latch circuit LT to outside as output data DOUT. Global I/O line pairs GIOP have global I/O lines GIO and /GIO.

Gate circuit IOG0 further includes an equalizing circuit EQ which equalizes bit lines BLj and /BLj. Equalizing circuit EQ electrically connects and equalizes bit lines BLj and /BLj in response to the input of control signal BLEQ generated by row decoder 20. Equalizing circuit EQ is electrically coupled to an unillustrated ground voltage GND and is precharged.

An equalizing circuit EQ of the same kind, which is provided between local I/O lines LIO and /LIO, electrically connects and equalizes local I/O lines LIO and /LIO in response to the input of control signal BLEQ. Equalizing circuit EQ is electrically coupled to an unillustrated ground voltage GND and is precharged.

Before data reading, local I/O lines LIO and /LIO and bit lines BLj and /BLj are electrically coupled to ground voltages GND to be precharged in response to the input of control signal BLEQ. This can secure the operational reliability of memory cells MC without applying a high voltage to them.

Figure 6:
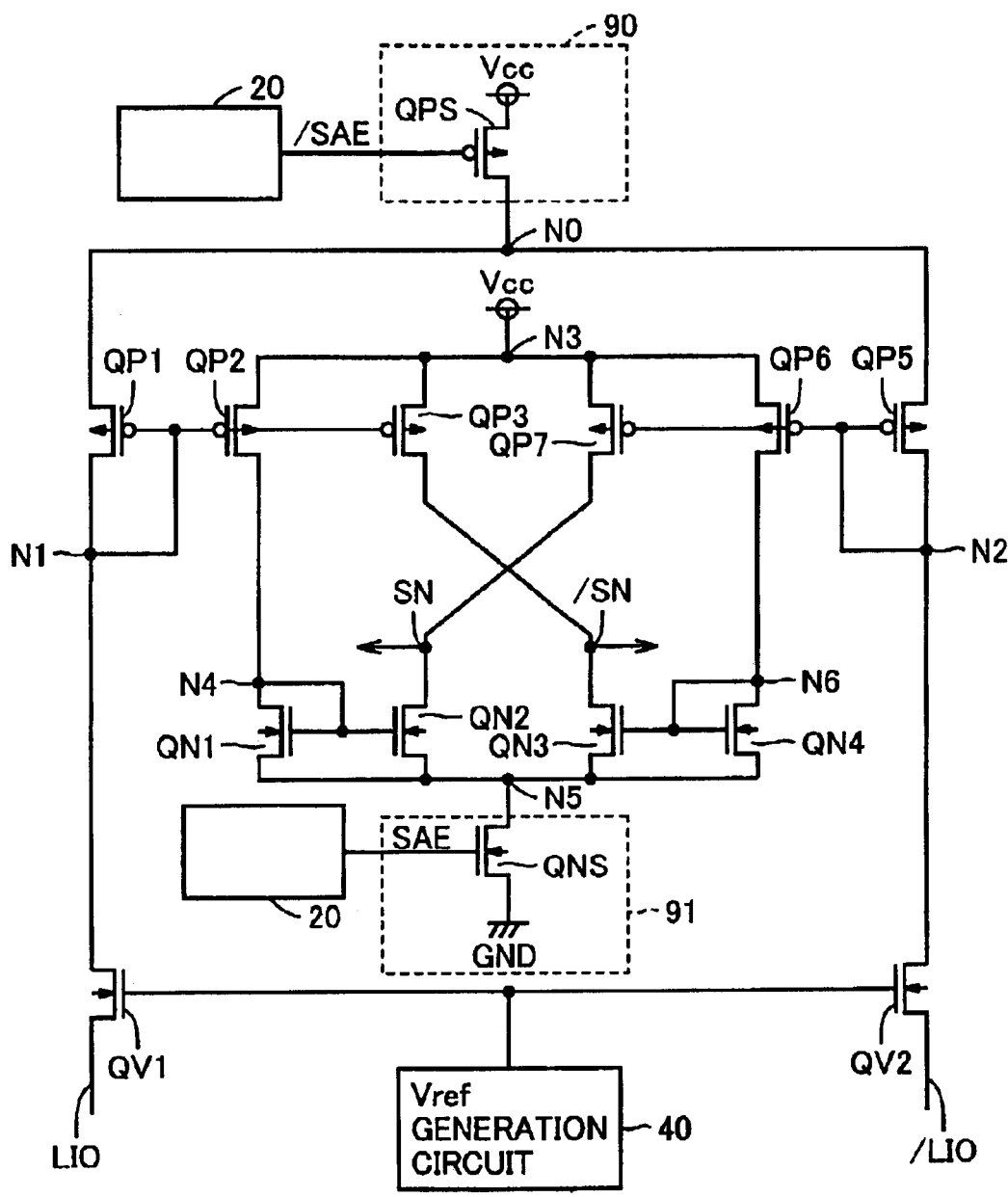
FIG. 6 is a circuit configuration diagram of a sense amplifier according to the first embodiment of the present invention.

With reference to FIG. 6, sense amplifier SA0 according to the first embodiment of the present invention includes: a voltage supply unit 90 for supplying a power supply voltage Vcc to power supply node N0; a transistor QP1 which is arranged between node N0 and a node N1 and whose gate is electrically coupled to node N1; a transistor QP2 which is arranged between a node N3 supplied with power supply voltage Vcc and a node N4 and whose gate is electrically coupled to node N1; a transistor QP3 which is arranged between node N3 and a sense node /SN and whose gate is electrically coupled to node N1; a transistor QP5 which is arranged between node N0 and a node N2 and whose gate is electrically coupled to node N2; a transistor QP6 which is arranged between node N3 and a node N6 and whose gate is electrically coupled to node N2; a transistor QP7 which is arranged between node N3 and a sense node SN and whose gate is electrically coupled to node N2; a transistor QN1 which is arranged between node N4 and a node N5 and whose gate is electrically coupled to node N4; a transistor QN2 which is arranged between sense node SN and node N5 and whose gate is electrically coupled to node N4; a transistor QN3 which is arranged between sense node /SN and node N5 and whose gate is electrically coupled to node N6; a transistor QN4 which is arranged between node N5 and node N6 and whose gate is electrically coupled to node N6; and a voltage supply unit 91 for supplying ground voltage GND to node N5.

Sense amplifier SA0 further includes: a transistor QV1 which is arranged between node N1 and local I/O line LIO and whose gate receives a reference voltage Vref generated by a Vref generation circuit 40; and a transistor QV2 which is arranged between node N2 and local I/O line /LIO and whose gate receives reference voltage Vref. Transistors QV1 and QV2 maintain local I/O lines LIO and /LIO at the reference voltage or less.

Voltage supply unit 90 includes a transistor QPS arranged between power supply voltage Vcc and node N0 and its gate receives a control signal /SAE which is activated to "L" level by row decoder 20 at the time of data. reading. Voltage supply unit 91 includes a transistor QNS which is arranged between ground voltage GND and node N5, and its gate receives a control signal SAE which is activated to "H" level by row decoder 20 at the time of data reading. As the result of the input of control signals SAE and /SAE, sense amplifier SA0 is activated.

Transistors QP1 to QP7 and QPS can be P-channel MOS transistors as an example. On the other hand, transistors QN1 to QN4, QNS, QV1 and QV2 can be N-channel MOS transistors, as an example. In the present embodiment, transistors QP1 to QP7 are of the same transistor size, and transistors QN1 to QN4 are of the same transistor size.

Transistors QP1 to QP3 form a current mirror circuit and supply the same amount of operating current (mirror current). Transistors QP5 to QP7 form another current mirror circuit and supply the same amount of operating current. Transistors QN1 and QN2 form another current mirror circuit and supply the same amount of operating current (mirror current). Transistors QN3 and QN4 form another current mirror circuit and supply the same amount of operating current. The present embodiment has been described on the state that each transistor is of the same transistor size; however, it is possible to have different transistor sizes so as to adjust the amount of operating current. To be more specific, the operating current is supplied in accordance with the size ratio of the transistors forming the current mirror circuits. This holds true in the following.

Sense amplifier SA0 according to the first embodiment of the present invention maintains local I/O lines LIO and /LIO at the reference voltage or less, and causes a voltage difference between sense nodes SN and /SN which corresponds to the difference in passing currents between local I/O lines LIO and /LIO.

The sensing operation of sense amplifier SA0 will be described.

The following describes the case where passing currents Ia and Ib are flown through local I/O lines LIO and /LIO. Since transistors QP1 to QP3 form a current mirror circuit, transistors QP2 and QP3 intend to supply node N4 and sense node /SN with the same amount of operating current as passing current Ia flowing through transistor QP1. At the same timing, transistors QP6 and QP7 intend to supply node N6 and sense node SN with the same amount of operating current as passing current Ib flowing through transistor QP5. On the other hand, since transistors QN1 and QN2 also form a current mirror circuit, transistor QN2 intends to supply node N5, which is connected with the ground voltage, with the same operating current Ia as transistor QN1 from sense node SN. Since transistors QN3 and QN4 also has a current mirror circuit, transistor QN3 intends to supply node N5 connected to ground voltage GND with the same operating current Ib as transistor QN4 from sense node /SN.

Consequently, sense node SN intends to be supplied with operating current Ib from transistor QP7, whereas transistor QN2 intends to feed at the same operating current Ia as transistor QN1 from sense node SN. On the other hand, sense node /SN intends to be supplied with operating current Ia from transistor QP3, whereas transistor QN3 intends to feed at the same operating current Ib as transistor QN4 from sense node /SN.

Therefore, sense amplifier SA0 makes the current mirror circuits produce mirror currents according to the passing currents which flow through local I/O lines LIO and /LIO, and converts the current difference between the generated mirror currents into a voltage difference to output it to sense nodes SN and /SN. When the operating currents are in the conditions of Ia>Ib, for example, the voltage levels of sense nodes SN and /SN are converted to "L" level and "H" level, respectively. On the other hand, when the operating currents are in the conditions of Ib>Ia, the voltage levels of sense nodes SN and /SN are converted into "H" level and "LV" level, respectively.

Next, a description will be given of the circuit configuration of preamplifier PA0.

Figure 7:
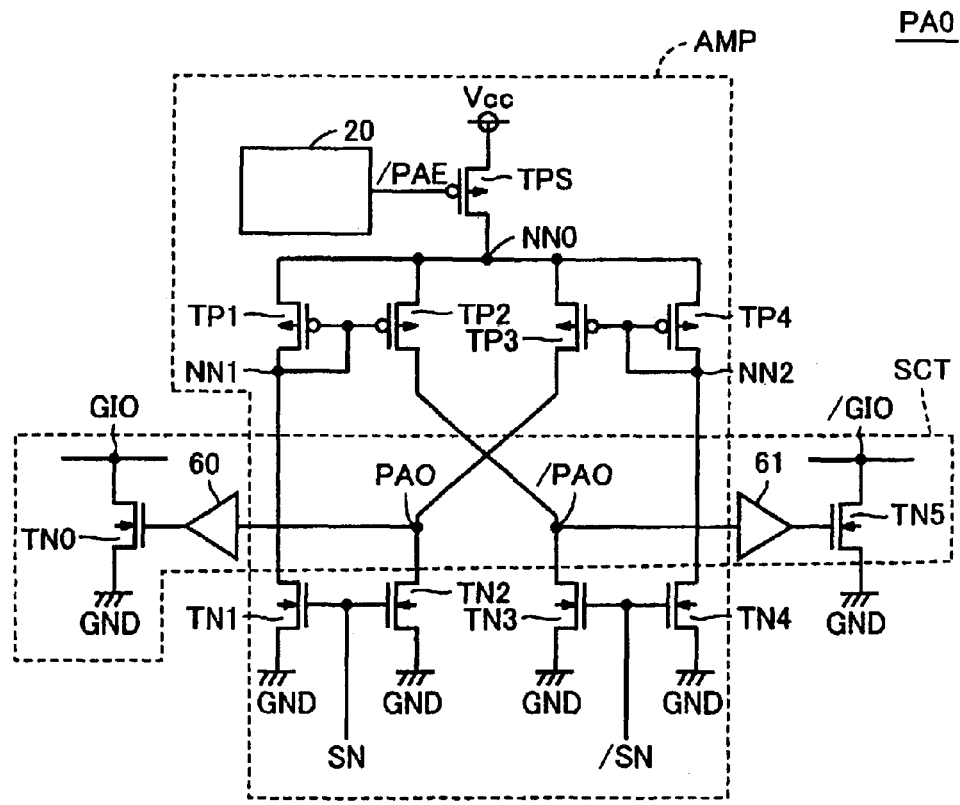
FIG. 7 is a circuit configuration diagram of a preamplifier according to the first embodiment of the present invention.

With reference to FIG. 7, preamplifier PA0 according to the first embodiment of the present invention includes: an amplifying signal generation circuit AMP which further amplifies the voltage difference between sense nodes SN and /SN and generates amplified voltage signals in internal nodes PAO and /PAO; and a voltage adjusting unit SCT which adjusts the voltage levels of global I/O lines GIO and /GIO in response to the voltage signals generated by internal nodes PAO and /PAO.

Amplifying signal generation circuit AMP includes: a transistor TPS which is arranged between a node NN0 and a power supply voltage Vcc and supplies power supply voltage Vcc to node NN0 in response to control signal /PAE from row decoder 20; a transistor TP1 which is arranged between node NN0 and a node NN1 and whose gate is electrically coupled to node NN1; a transistor TP2 which is arranged between node NN0 and internal node /PAO and whose gate is electrically coupled to node NN1; a transistor TP3 which is arranged between node NN0 and internal node PAO and whose gate is electrically coupled to node NN2; a transistor TP4 which is arranged between node NN0 and node NN2 and whose gate is electrically coupled to node NN2; a transistor TN1 which is arranged between node NN1 and ground voltage GND and whose gate is electrically coupled to sense node SN; a transistor TN2 which is arranged between internal node PAO and ground voltage GND and whose gate is electrically coupled to sense node SN; a transistor TN3 which is arranged between internal node /PAO and ground voltage GND and whose gate is electrically coupled to sense node /SN; and a transistor TN4 which is arranged between node NN2 and ground voltage GND and whose gate is electrically coupled to sense node /SN. Transistors TP1 and TP2 form a current mirror circuit and intend to supply the same amount of operating current. Transistors TP3 and TP4 form a current mirror circuit and intend to supply the same amount of operating current.

Transistors TP1 to TP4 and TPS can be P-channel MOS transistors as an example. On the other hand, transistors TN1 to TN4 can be N-channel MOS transistors, as an example. In the present embodiment, transistors TP1 to TP4 are of the same transistor size, and transistors TN1 to TN4 are of the same transistor size.

As an example, when sense nodes SN and /SN are at "H" level and "V" level, respectively, transistor TN2 is turned on, thereby electrically connecting internal node PAO to ground voltage GND so as to set internal node PAO at "L" level. On the other hand, internal node /PAO intends to be supplied with the same amount of operating current as transistor TP1 from transistor TP2, but almost no current is flown from transistor TN3 because sense node /SN is at "L" level. Therefore, the voltage level of internal node /PAO is set at "H" level.

In sense amplifiers SA mentioned above, a voltage difference is generated according to the storage data in a selected memory cell in sense nodes SN and /SN. For more stable data reading, amplifying signal generation circuit AMP performs an operation to further amplify the voltage difference.

Voltage adjusting unit SCT includes: buffers 60 and 61 which output the levels of voltages generated by internal nodes PAO and /PAO in a stable manner; a transistor TN0 which is arranged between global I/O line GIO and ground voltage GND and whose gate receives the output signal of buffer 60; and a transistor TN5 which is arranged between global I/O line /GIO and ground voltage GND and whose gate receives the output signal of buffer 61. As transistors TN0 and TN5, N-channel MOS transistors are used.

Global I/O lines GIO and /GIO are precharged at the predetermined voltage levels by the predetermined precharge operation before data reading.

In accordance with the voltage signals generated in internal nodes PAO and /PAO, one of global I/O lines GIO and /GIO is electrically coupled to ground voltage GND. Consequently, one of the logical levels of global I/O lines GIO and /GIO is set at "H" level, and the other is set at "L" level.

Therefore, global I/O lines GIO and /GIO can be set at fixed logical levels of power supply voltage Vcc and ground voltages GND in correspondence with the storage data of the memory cell, thereby performing stable data reading.

Figure 8:
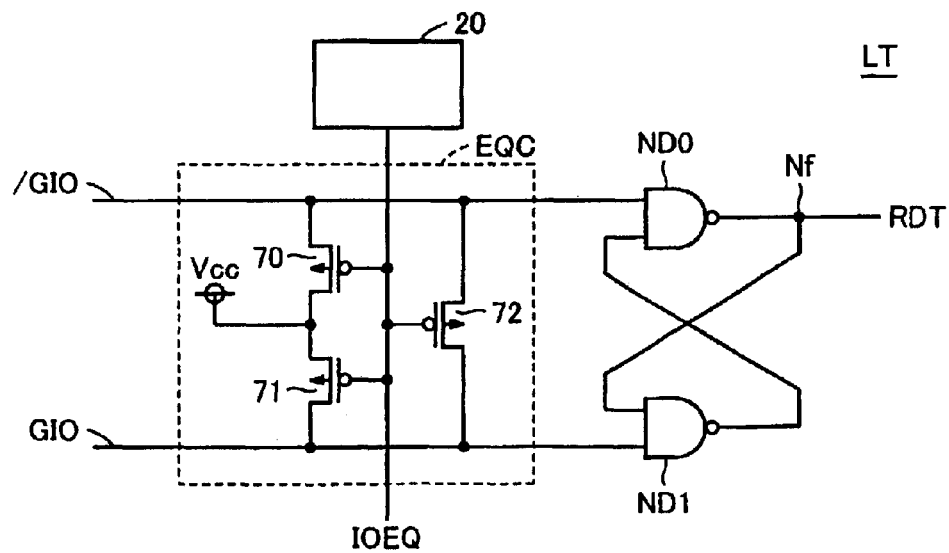
FIG. 8 is a circuit configuration diagram of a latch circuit according to the first embodiment of the present invention.

With reference to FIG. 8, latch circuit LT according to the first embodiment of the present invention includes an equalizing unit EQC for equalizing global I/O lines GIO and /GIO, and NAND circuits ND0 and ND1.

Equalizing unit EQC includes transistors 70 to 72. Transistors 70 and 71 are connected in series between global I/O lines GIO and /GIO, and their gates receive control signal IOEQ from row decoder 20. The connection node of transistors 70 and 71 is electrically coupled to power supply voltage Vcc. Transistor 72 is arranged between global I/O lines GIO and /GIO, and its gate receives control signal IOEQ. To be more specific, when control signal IOEQ which is at "L" level is inputted before data reading, power supply voltage Vcc ("H" level) is electrically coupled to global I/O lines GIO and /GIO, which are then precharged. As transistors 70 to 72, P-channel MOS transistors are used.

NAND circuit ND1 receives inputs from global I/O line GIO and output node Nf, and outputs NAND logical calculation results to the input node of ND0. NAND circuit ND0 receives the output signals of global I/O line /GIO and NAND circuit ND1, and outputs NAND logical calculation results to output node Nf. Latch circuit LT outputs the voltage level generated by output node Nf as read data RDT to output buffer OBF.

For example, assume that output node Nf is set at "L" level in the initial condition. In the case where global I/O line GIO is set at "L" level after global I/O line pairs GIOP are precharged, the voltage level of output node Nf is latched at "L" level by the logical operations of NAND circuits ND0 and ND1. On the other hand, when global I/O line /GIO is set at "L" level, the voltage level of output node Nf is latched at "H" level by the logical operations. Read data RDT corresponding to the latched voltage signal is outputted to output buffer OBF. Latch circuit LT and output buffer OBF shown in the present embodiment form a data generation circuit for generating output data.

The data read operation according to the first embodiment of the present invention will be described with reference to the timing chart of FIG. 9. The description will be given of the data read operation of memory array MA0.

At time t1, an address ADD effective to perform a data read operation is inputted. As a result, memory array MA0 is selected, and at time t2 control signals SAE and /SAE for activating sense amplifier SA0 corresponding to selected memory array MA0 are set at "H" level and "L" level, respectively. Consequently, sense amplifier SA0 is activated, and sense nodes SN and /SN of sense amplifier SA0 start to make a transition to the predetermined intermediate potential between power supply voltage Vcc and ground voltages GND. This causes sense amplifier SA0 to perform a preparing operation for an amplifying operation. In response to control signal SAE, local I/O line pairs LIOP start to be charged by power supply voltage Vcc.

At time t3, column selection line CSLj, word lines RWLi and RWLr corresponding to address ADD inputted are activated ("H" level). In response to the activation of the selected column selection line CSLj, bit line pairs BLPj of the selected column and local I/O line pairs LIOP are electrically coupled to each other. To be more specific, in response to the tuning on of gate transistors CSGa and CSGb, bit line BLj and local I/O line LIO are electrically coupled to each other, whereas bit line /BLj and local I/O line /LIO are electrically coupled to each other. In response to the activation of the selected word line RWLi, local I/O line LIO is pulled down to ground voltage GND through bit line BLj and the selected memory cell MC. In response to the activation of word line RWLr, local I/O line /LIO is pulled down to ground voltage GND through bit line /BLj and dummy memory cell DMC. In response to control signal /SAE ("L" level), current paths are formed between sense amplifier SA0 and the selected memory cell MC and dummy memory cell DMC, thereby performing the predetermined sensing operation in sense amplifier SA0. Column selection gates CSG, column decoder 25 and column selection lines CSL form an address selection unit.

To be more specific, sense amplifier SA0 intends to supply the same amount of current to local I/O lines LIO and /LIO. However, there is an electric resistance difference AR between memory cell MC corresponding to the selected address and dummy memory cell DMC. Therefore, at time t3, there is going to be a current difference between the passing currents. In other words, electric resistance difference AR is converted into the difference in passing currents between transistors QP1 and QP5. The passing current difference between transistors QP1 and QP5 is caused between sense nodes SN and /SN as a voltage difference by the above-mentioned amplifying operation.

At time t4 when the voltage difference is fully amplified in sense nodes SN and /SN since time t3, control signal /PAE ("L" level), which is the reverse signal of control signal PAE and activates preamplifier PA, is inputted. This further amplifies the difference between the voltages inputted from sense nodes SN and /SN in preamplifier PA up to the voltage level of power supply voltage Vcc and ground voltage GND. As a result, the voltage level generated by the amplifying operation of internal nodes PAO and /PAO pulls down one of global I/O lines GIO and /GIO from the predetermined voltage level at which it is precharged to ground voltage GND ("L" level). Latch circuit LT latches storage data read from the selected memory cell according to the predetermined logical level transmitted to global I/O line pairs GIOP, and outputs it as read data RDT to output buffer OBF. Output buffer OBF outputs output data DOUT outside at time t5, based on read data RDT transmitted from latch circuit LT. This can perform a data read operation of the selected memory cell corresponding to address ADD inputted.

On the other hand, no voltage difference is caused between completely charged bit lines BLj, /BLj and between local I/O lines LIO, /LIO, and so the voltage of each of local I/O lines LIO, /LIO and bit lines BLj, /BLj is settled at "Vref-Vth-Vmc". In this case, Vth corresponds to the threshold voltage of transistors QV1 and QV2, and Vmc corresponds to a voltage drop appearing in memory cell MC and dummy memory cell DMC. Reference voltage Vref generated in Vref generation circuit 40 is set so that the above-mentioned voltage "Vref-Vth-Vmc" becomes about 400 mV by considering the reliability and other conditions of the insulating film which is a tunneling barrier in the tunneling magneto-resistance elements.

Thus providing transistors QV1 and QV2 and setting each voltage of local I/O lines LO, /LIO and bit lines BLj, /BLj at a level below the reference voltage of "Vref-Vth-Vmc" can prevent memory cell breakage resulting from excess voltage application, thereby improving operational reliability.

In sense amplifier SA0 according to the first embodiment of the present invention, the operating current corresponds to the memory cell current according to the storage data of the memory cell, and therefore the operating current resulting from the amplifying operation of the sense amplifiers SA becomes extremely small. It is therefore possible to achieve sense amplifiers SA with reduced power consumption.

In the case where power supply voltage Vcc is low because sense amplifiers SA are driven by a small operating current, an operating current can be easily secured so as to secure the data reading margin.

The present embodiment describes the case where the resistance value of the tunneling magneto-resistance elements of the dummy memory cells used to compare with memory cells MC is fixed at the intermediate resistance value between resistance values Rmax and Rmin that the normal memory cells have. Alternatively, it is possible to set the electric resistance value of the dummy memory cells at an intermediate resistance value by setting the resistance value of the tunneling magneto-resistance elements at Rmin and adjusting the transistor size of the access transistor. It is also possible to provide an unillustrated resistance whose composed resistance becomes the intermediate resistance value in the predetermined region of the current path for flowing dummy memory cells DMC, instead of adjusting the access transistor.

In sense amplifiers SA of the present embodiment, the transistor size of transistors QP1, QP5, QV1 and QV2 can be designed larger than the transistor size of the other peripheral circuits. It is therefore possible to increase the rate of charging local I/O lines LIO, /LIO to the predetermined voltage level, thereby increasing the rate of data reading.

Modification of First Embodiment

According to a modification of the first embodiment of the present invention, a description will be given of the configuration of data reading circuits in the case where memory cell MC is fixedly connected through access transistor ATR not to ground voltage GND but to power supply voltage Vcc.

Figure 10:
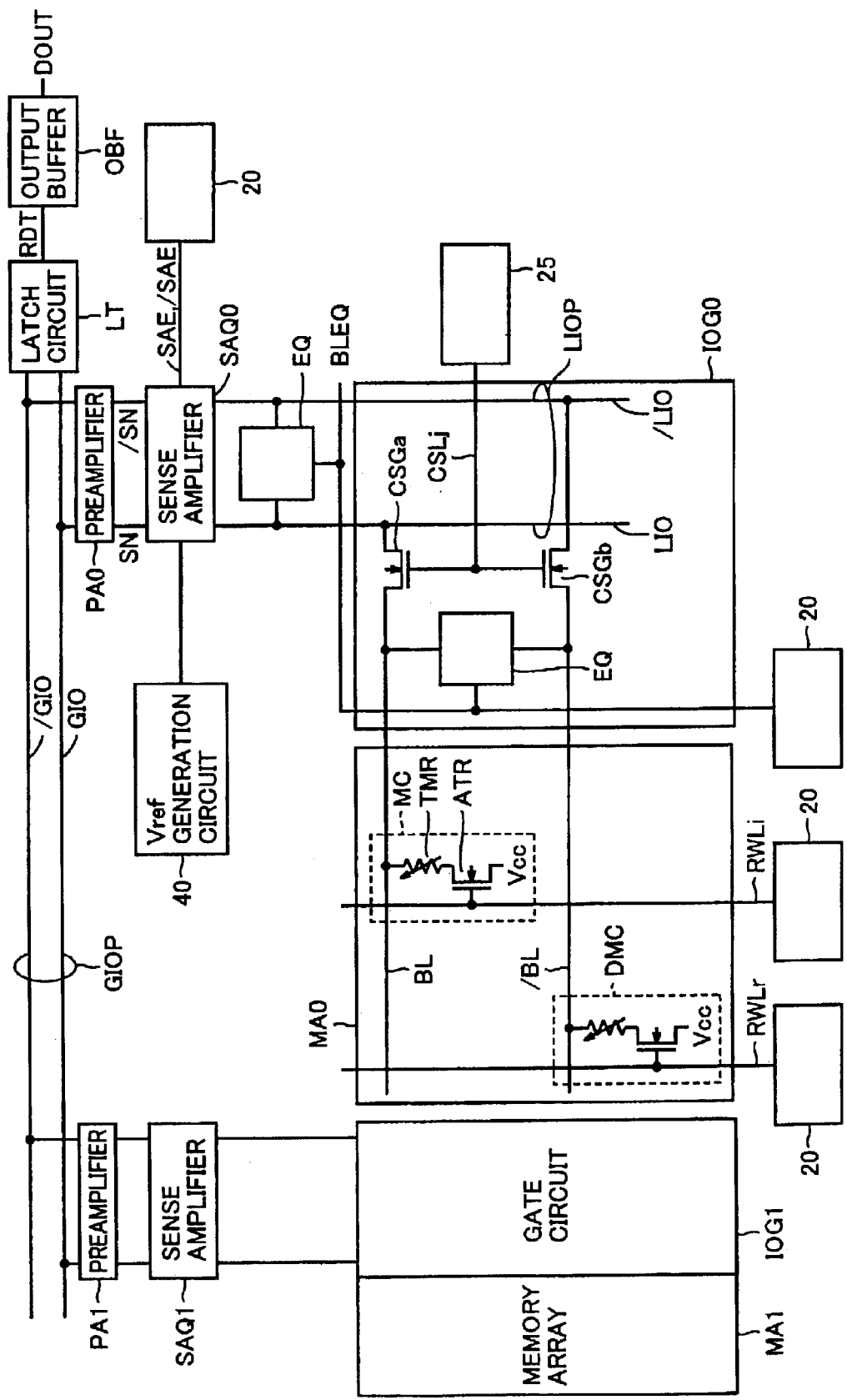
FIG. 10 is a conceptual diagram showing a data reading circuit according to a modification of the first embodiment of the present invention.

With reference to FIG. 10, the data reading circuits according to the modification of the first embodiment of the present invention differ from the data reading circuits shown in FIG. 2 in that sense amplifiers SAQ uses in place of sense amplifiers SA. The other components, which have the same configuration, will not be repeatedly described. The present embodiment shows a sense amplifier SAQ0 provided in correspondence with memory array MA0 and a sense amplifier SAQ1 provided in correspondence with memory array MA1.

Figure 11:
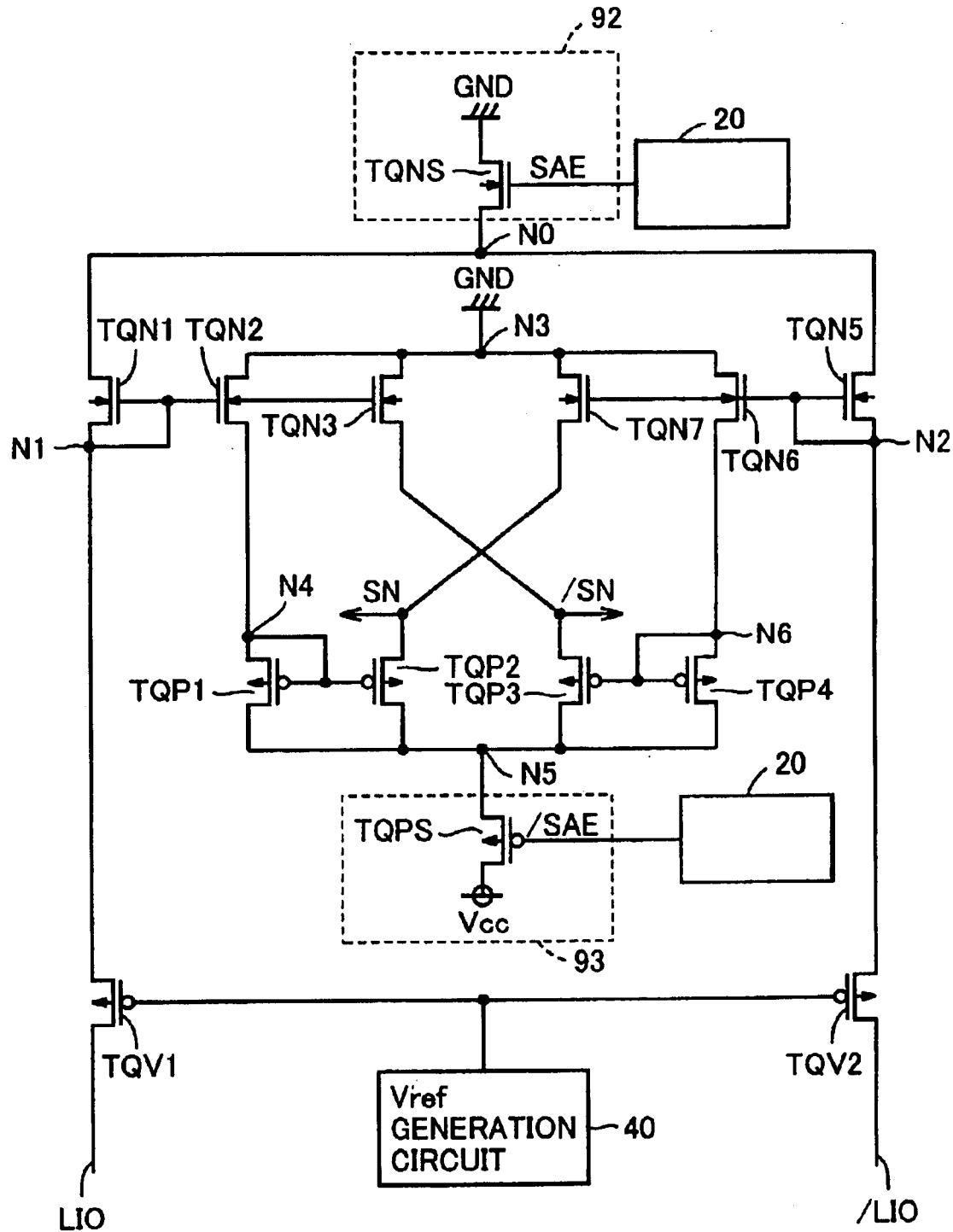
FIG. 11 is a circuit configuration diagram of a sense amplifier according to the modification of the first embodiment of the present invention.

With reference to FIG. 11, the circuit configuration of sense amplifiers SAQ according to the modification of the first embodiment of the present invention will be described.

The sense amplifiers SAQ include: a voltage supply unit 92 which supplies a ground voltage GND to a node N0; a transistor TQN1 which is arranged between node N0 and a node N1 and whose gate is electrically coupled to node N1; a transistor TQN2 which is arranged between a node N3 and a node N4 which is supplied with a ground voltage GND and whose gate is electrically coupled to node N1; a transistor TQN3 which is arranged between node N3 and a sense node /SN and whose gate is electrically coupled to node N1; a transistor TQN5 which is arranged between node N0 and node N2 and whose gate is electrically coupled to node N2; a transistor TQN6 which is arranged between node N3 and a node N6 and whose gate is electrically coupled to node N2; a transistor TQN7 which is arranged between node N3 and a sense node SN and whose gate is electrically coupled to node N2; a transistor TQP1 which is arranged between node N4 and a node N5 and whose gate is electrically coupled to node N4; a transistor TQP2 which is arranged between sense node SN and node N5 and whose gate is electrically coupled to node N4; a transistor TQP3 which is arranged between sense node /SN and node N5 and whose gate is electrically coupled to node NG; a transistor TQP4 which is arranged between node N5 and node N6 and whose gate is electrically coupled to node N6; and a voltage supply unit 93 which supplies power supply voltage Vcc to node N5.

The sense amplifiers SAQ include: a transistor TQV1 which is arranged between node N1 and local I/O line LIO and whose gate receives reference voltage Vref generated by Vref generation circuit 40; and a transistor TQV2 which is arranged between node N2 and local I/O line /LIO and whose gate receives reference voltage Vref. Transistors TQV1 and TQV2 keep local I/O lines LIO and /LIO below the reference voltage.

Voltage supply unit 92 includes a transistor TQNS arranged between a ground voltage GND and node N0 and its gate receives a control signal SAE which is activated to "H" level by row decoder 20 at the time of data reading. Voltage supply: unit 93 includes a transistor TQPS which is arranged between power supply voltage Vcc and node N5, and its gate receives a control signal /SAE which is activated to "L" level by row decoder 20 at the time of data reading. As the result of the input of control signals SAE and /SAE, sense amplifiers SAQ are activated.

Transistors TQP1 to TQP4, TQPS, TQV1 and TQV2 can be P-channel MOS transistors as an example. On the other hand, transistors TQN1 to TQN7 and TQNS can be N-channel MOS transistors, as an example. In the present embodiment, transistors TQP1 to TQP4 are of the same transistor size, and transistors TQN1 to TQN7 are of the same transistor size.

Transistors TQN1 to TQN3 form a current mirror circuit and intend to supply the same amount of operating current. Transistors TQN5 to TQN7 form another current mirror circuit and intend to supply the same amount of operating current. Transistors TQP1 and TQP2 form another current mirror circuit and intend to supply the same amount of operating current. Transistors TQP3 and TQP4 form another current mirror circuit and intend to supply the same amount of operating current.

In the present circuit configuration, the P-channel MOS transistors and the N-channel MOS transistors of sense amplifier SA0 shown in FIG. 6 described in the first embodiment are replaced with each other and power supply voltage Vcc and ground voltage GND are replaced with each other.

The present configuration differs from the configuration shown in FIG. 6 in that the direction to flow the operating current resulting from the amplifying operation is reversed, and the other operations are performed in the same manner as in FIG. 6. To be more specific, the passing current difference caused in the local I/O lines LIO and /LIO is converted into a voltage difference and occurs in the sense nodes SN and /SN. This configuration can obtain the same effects as in the first embodiment.

Second Embodiment

In the first embodiment, the description has been given of the configuration where sense amplifier SA0 is activated by entering control signals SAE and /SAE to sense amplifier SA0 at the same timing as to the sense amplifiers SA.

In a second embodiment of the present invention, a description will be given of a configuration where control signals SAE and /SAE are inputted to sense amplifier SA0 at different timings.

Figure 12:
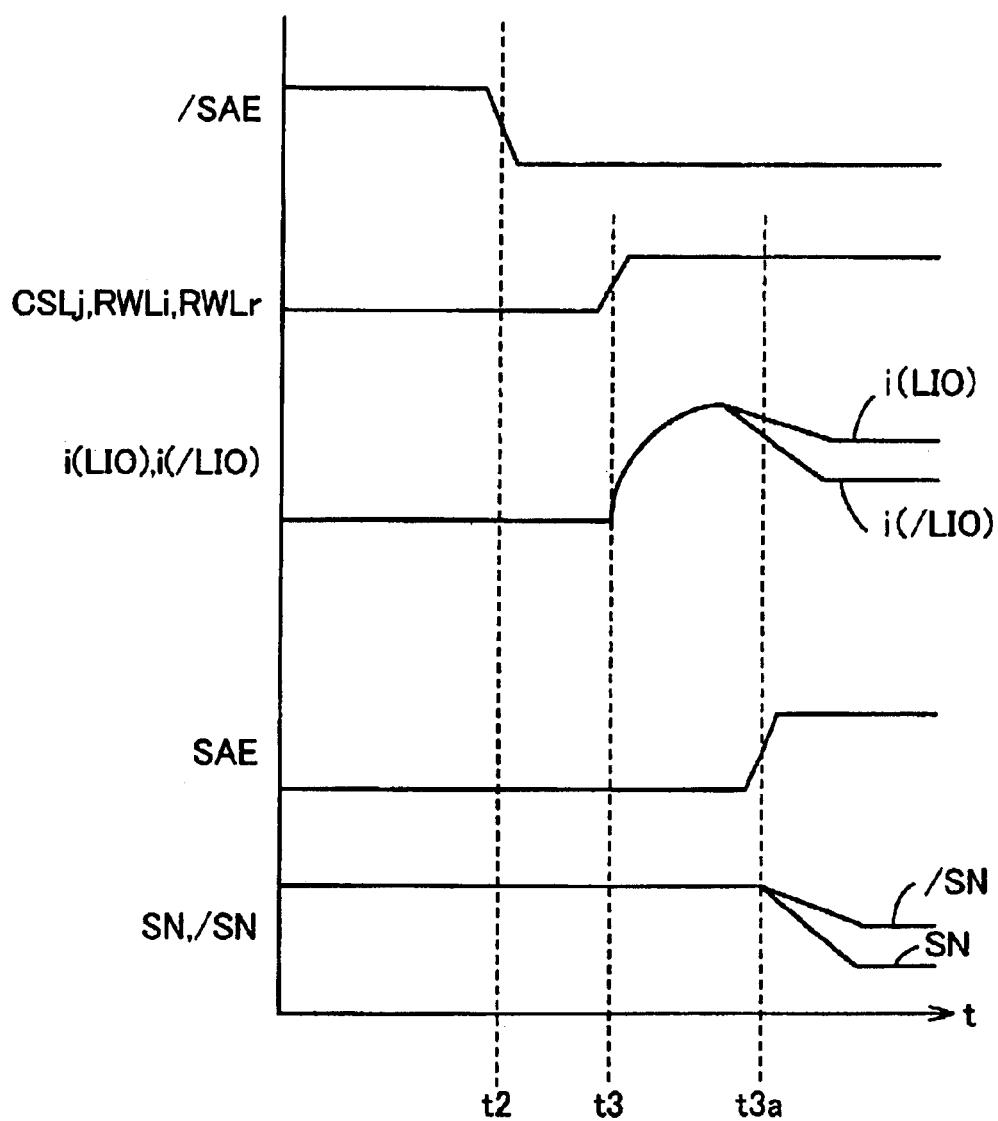
FIG. 12 is a timing chart for describing an operation of a sense amplifier according to a second embodiment of the present invention.

The operation of sense amplifier SA0 according to the second embodiment of the present invention will be described with reference to the timing chart of FIG. 12.

Figure 9:
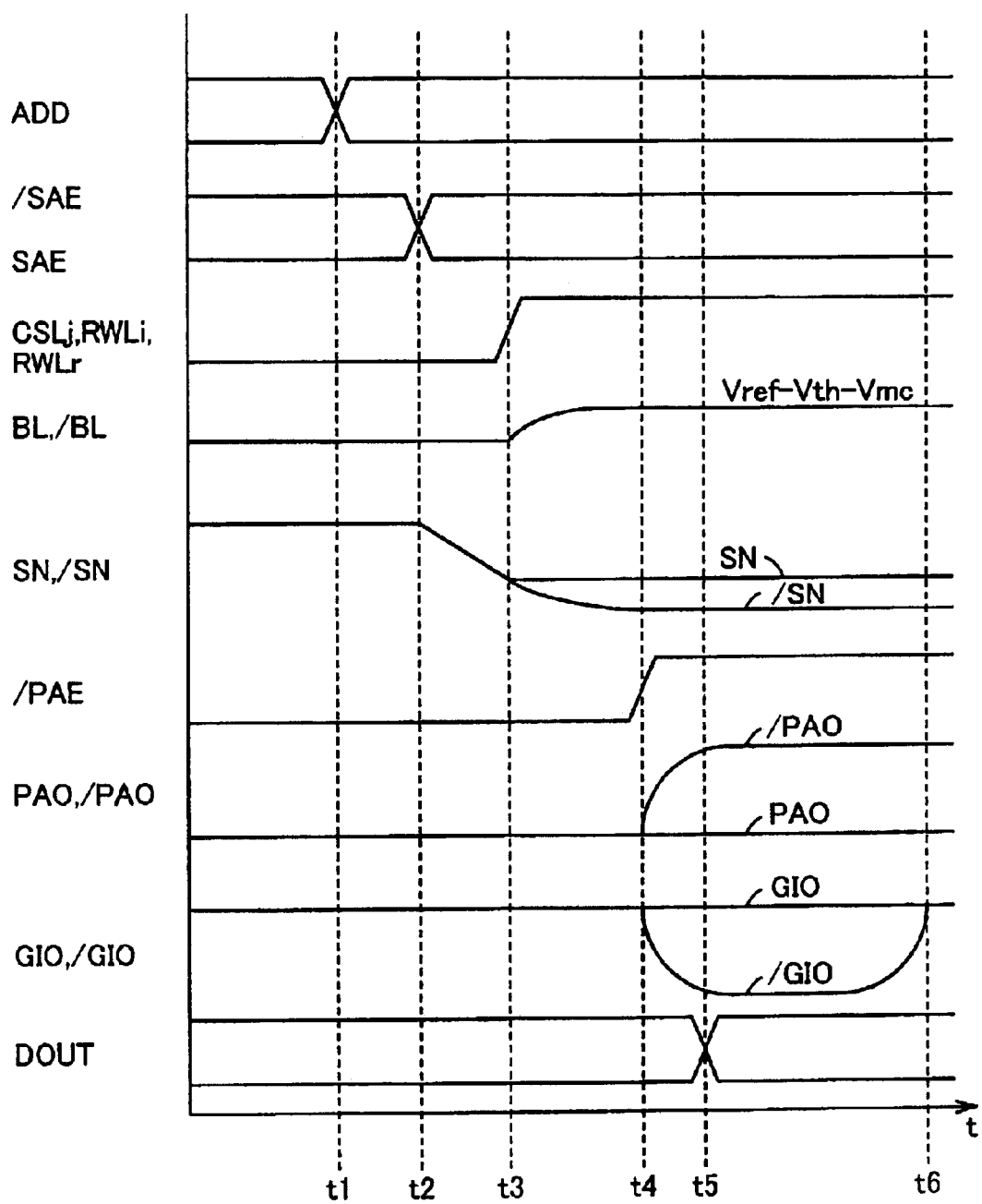
FIG. 9 is a timing chart for describing a data read operation according to the first embodiment of the present invention.

Not being illustrated, control signal /SAE is set at "L" level at time t2, after effective address ADD is inputted at time t1 in the same manner as FIG. 9 according to the first embodiment. This turns on transistor QPS of sense amplifier SA0, and starts to charge local I/O lines LIO and /LIO up to the predetermined voltage level. At time t3, column selection line CSLj, word lines RWLi and RWLr are set at "H" level. As a result, current paths are formed in bit line pairs BLP and local I/O line pairs LIOP. In other words, passing currents start to flow through the current paths according to the electric resistances of the selected memory cell and the dummy memory cell. Control signal SAE is activated to "H" level at time t3a which is approximately the same timing as a current difference begins to appear in local I/O lines LIO and /LIO according to the storage data.

As a result, an amplifying operation is started to convert the current difference into a voltage difference inside the sense amplifier SA0. To be more specific, at time t3a, an operating current in sense amplifier SA0 is supplied and the passing current difference between local I/O lines LIO and /LIO is caused as the voltage difference in sense nodes SN and /SN.

Not being illustrated, operations of preamplifier PA0, latch circuit LT output buffer OBF and the like on and after time t4 are the same as those in the first embodiment, and therefore the description will not be repeated.

In the configuration of the data reading circuits according to the second embodiment, control signals /SAE and SAE are inputted to sense amplifier SA0 at different timings. To be more specific, control signal /SAE is activated ("L" level) first to perform the charging of local I/O line pairs LIOP and then control signal SAE is activated to "H" level. Then control signal SAE is activated after local I/O line pairs LIOP are fully charged, so as to supply an operating current.

This makes it possible to make the operating current caused before the appearance of the passing current difference according to the storage data in local I/O lines LIO and /LIO smaller than in the sense amplifiers according to the first embodiment. In other words, sense amplifiers with less power consumption than the sense amplifiers according to the first embodiment can be realized.

Modification of Second Embodiment

In the second embodiment, the description has been given of the configuration to reduce the power consumption of the sense amplifiers by activating control signal /SAE earlier than control signal SAE.

In a modification according to the second embodiment of the present invention, a description will be given of a configuration where control signal SAE is activated earlier than control signal /SAE.

Figure 13:
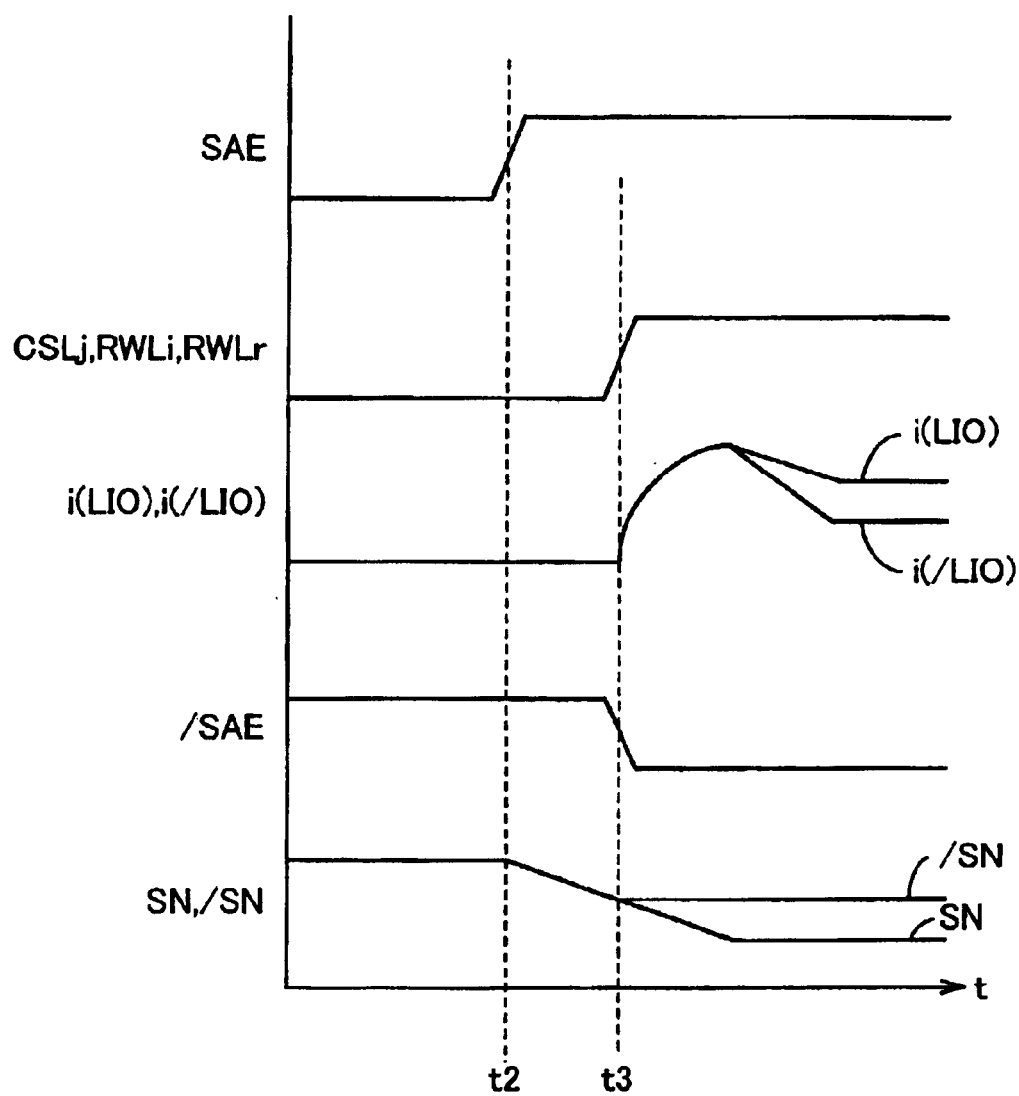
FIG. 13 is a timing chart for describing an operation of a sense amplifier according to a modification of the second embodiment of the present invention.

With reference to the timing chart of FIG. 13, operations of the sense amplifier SA0 of the modified example according to the modification of the second embodiment of the present invention will be described.

Not being illustrated, after effective address ADD is inputted at time t1 in the same manner as in FIG. 9 according to the first embodiment, control signal SAE is set at "H" level at time t2. This causes sense nodes SN, /SN to start to make a transition to an intermediate potential between power supply voltage Vcc and ground voltage GND, and an amplifying operation to be ready in sense amplifiers SA.

At time t3, column selection line CSLj and word lines RWLi, RWLr are activated to "H" level. At the same timing, control signal /SAE is activated to "L" level, As a result, the above-mentioned current paths are formed in bit line pairs BLP and local I/O line pairs LIOP. In other words, the passing current according to the electric resistances of the selected memory cell and the dummy memory cell starts to flow into the current paths. Thus the passing current difference between local I/O lines LIO and /LIO appears as a voltage difference in sense nodes SN and /SN.

Not being illustrated, operations of preamplifier PA0, latch circuit LT, output buffer OBF and the like on and after time t4 are the same as those in the first embodiment, and therefore the description will not be repeated.

According to the configuration of the data reading circuits according to the modification of the second embodiment of the present invention, control signal SAE is inputted to the sense amplifiers earlier than control signal /SAE, so that sense nodes SN and /SN inside sense amplifiers SA can make a transition to an intermediate level between power supply voltage Vcc and ground voltage GND, thereby first performing the preparing operation for amplification. Performing the preparing operation for amplification early can prevent malfunction and perform a stable amplifying operation, that is, data read operation.

Third Embodiment

In the first embodiment, the description has been given of the configuration of the data reading circuits for performing 1-bit data reading with sense amplifier SA0 corresponding to selected memory array MA0.

In a third embodiment, a description will be given of a configuration of the data reading circuits capable of performing parallel reading of plural-bit data.

Figure 14:
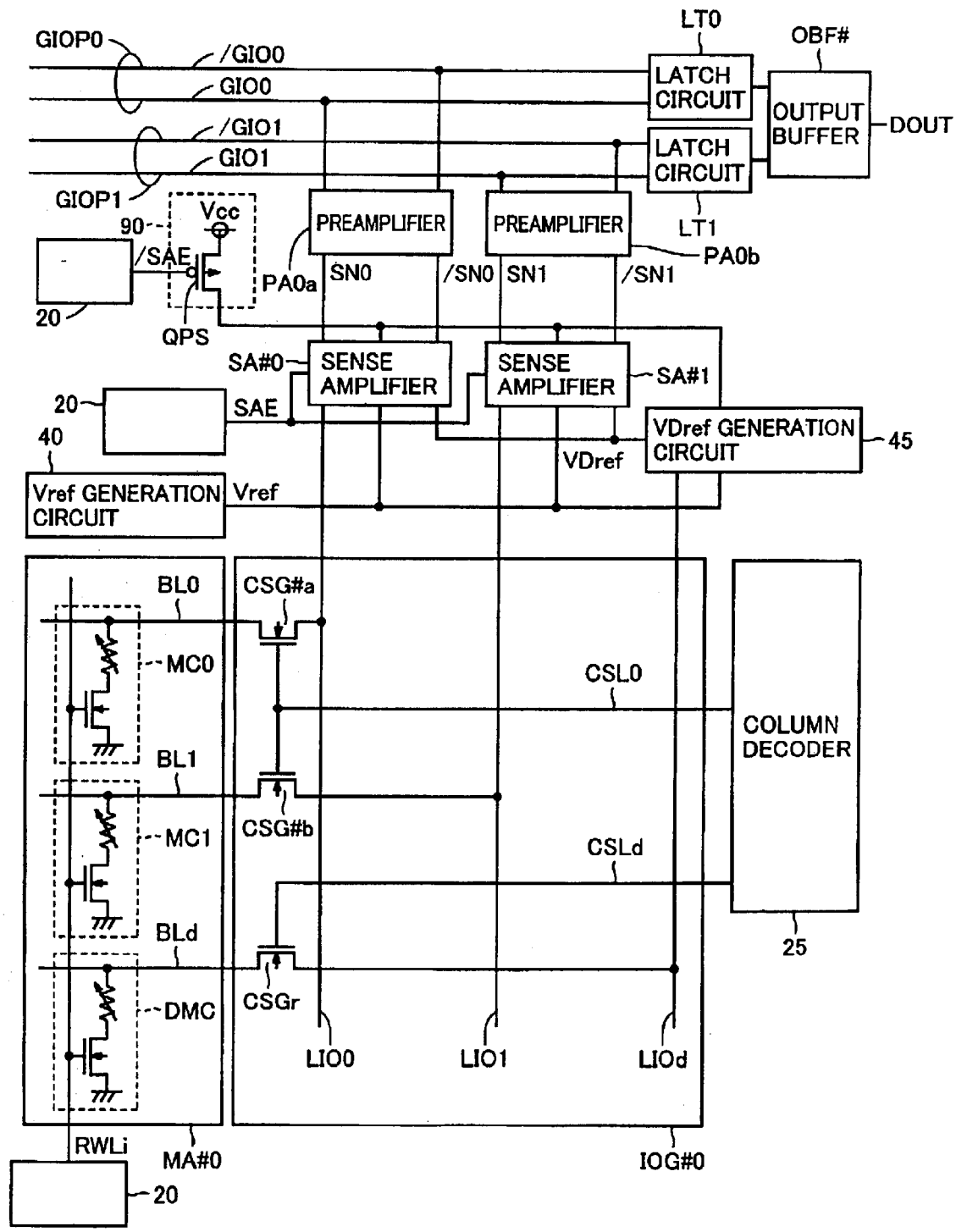
FIG. 14 is a conceptual diagram showing a data reading circuit according to a third embodiment of the present invention.

With reference to FIG. 14, the data reading circuits according to the third embodiment of the present invention include a memory array MA#0 in place of memory array MA0.

A group of circuits for a data read operation are provided in correspondence with memory array MA#0 included in the I/O control circuit according to the third embodiment of the present invention. Memory array MA#0 will be taken up as an example and described. The other memory arrays, which have the same configuration, and therefore the description will not be repeated.

Memory array MA#0 has the plurality of memory cells MC and dummy memory cells DMC arranged in the matrix. In memory array MA#0, the dummy memory cells are aligned so as to share the memory cell rows.

With this configuration, it is possible to realize efficient arrangement of the dummy memory cells, thereby reducing the area size of the memory arrays.

Memory array MA#0 includes the plurality of bit lines BL provided in correspondence with the memory cell columns and the plurality of word lines RWL provided in correspondence with the memory cell rows. In FIG. 14, bit lines BL0 and BL1 provided in correspondence with the memory cell columns and a bit line BLd provided in correspondence with the dummy memory cell column are shown representatively. In addition, a word line RWLi provided in correspondence with the memory cell row having memory cells MC0 and MC1 and dummy memory cell DMC is shown representatively.

In the I/O control circuit according to the third embodiment, the plurality of column selection lines CSL are provided in correspondence with the two bit lines corresponding to two adjacent memory cell columns, respectively. In this embodiment, for example, a column selection line CSL0 is provided in correspondence with bit lines BL0 and BL1. Also, a column selection line CSLd is provided in correspondence with the dummy memory cell column.

The I/O control circuit according to the third embodiment includes local I/O lines LIO1, LIO2 and UIOd, and a gate circuit IOG#0 which controls the connection between the bit lines and local I/O lines LIO.

Gate circuit IOG#0 includes: a gate transistor CSG#a which electrically connects local I/O line LIO0 and even-numbered bit lines BL in response to the column selection instruction of the column decoder; a gate transistor CSG#b which electrically connects local I/O line LIO1 and odd-numbered bit lines BL in response to the column selection instruction of the column decoder; and a gate transistor CSGr which electrically connects local I/O line LIOd and bit line BLd in response to the column selection instruction. In FIG. 14, column selection line CSL0 is connected to the gates of gate transistors CSG#a and CSG#b, whereas column selection line CSLd is connected to the gates of the gate transistor CSGr.

The I/O control circuit according to the third embodiment of the present invention includes sense amplifiers SA#0 and SA#1 which are provided in correspondence with local I/O lines LIO1 and LIO2 and which detect read data based on the passing current of the corresponding local I/O line LIO. The circuit further includes a VDref generation circuit 45 which is provided in correspondence with local I/O line LIOd and generates reference voltage VDref based on the passing current which flows through the dummy memory cells.

The I/O control circuit according to the third embodiment of the present invention includes a preamplifier PA0a which further amplifies the storage data detected by sense amplifier SA#0, and a preamplifier PA0b which further amplifies the storage data detected by sense amplifier SA#1.

The I/O control circuit according to the third embodiment is commonly provided unillustrated another memory arrays, respectively, and further includes: global I/O line pairs GIOP0 provided in correspondence with preamplifier PA0a; global I/O line pairs GIOP1 provided in correspondence with preamplifier PA0b; latch circuits LT0 and LT1 which are connected with global I/O line pairs GIOP0 and GIOP1, respectively, and latch storage data; and an output buffer OBF# which outputs read data RDT latched respectively by latch circuits LT0 and LT1 as output data DOUT to outside.

The global I/O line pairs GIOP0 include global I/O lines GIO0 and /GIO0. The global I/O line pairs GIOP1 include global I/O lines GIO1 and /GIO1.

Next, a description will be given of the configuration of sense amplifier SA#0 according to the third embodiment of the present invention.

Figure 15:
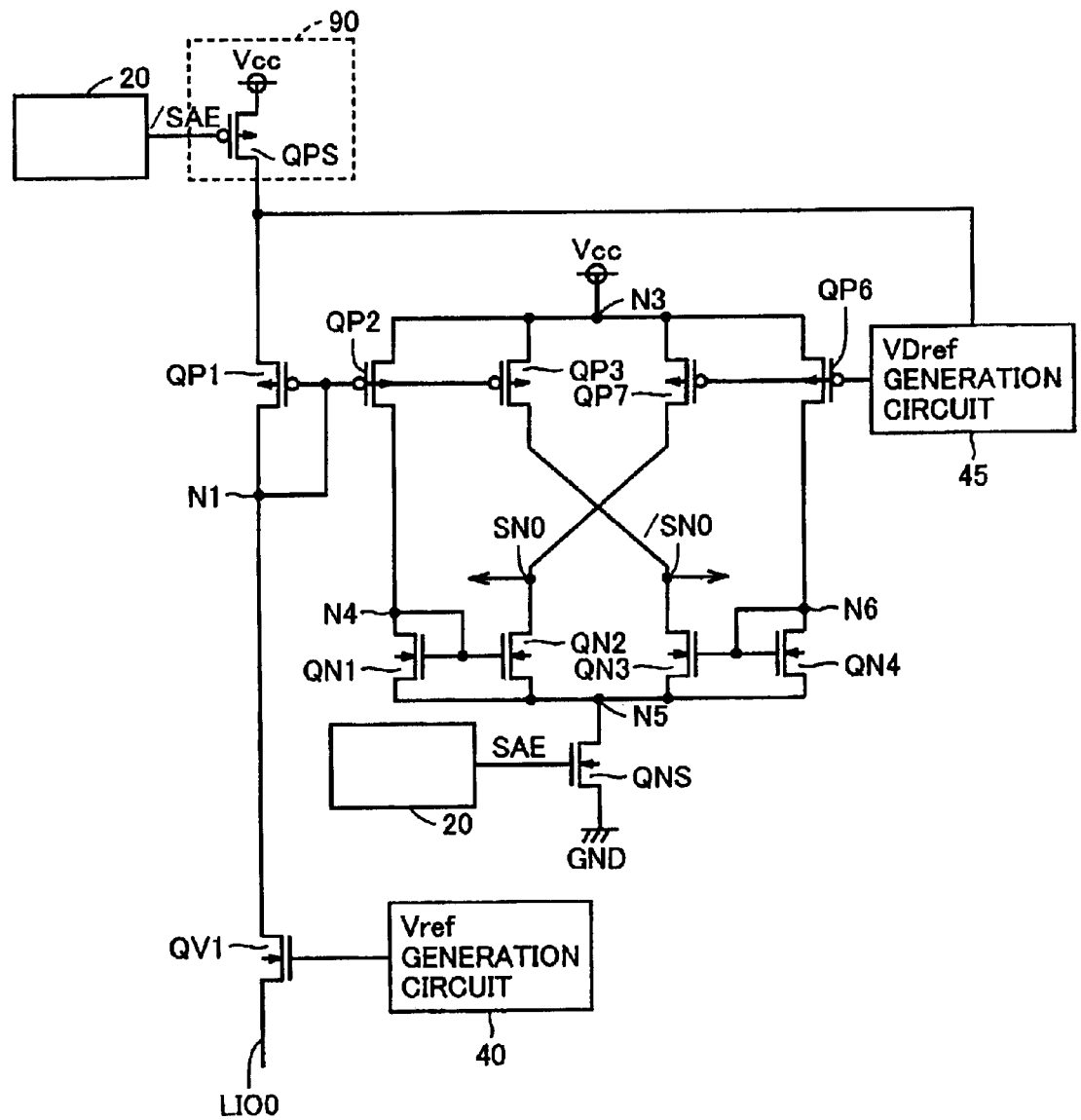
FIG. 15 is a circuit configuration diagram showing a sense amplifier and peripheral circuits according to the third embodiment of the present invention.

With reference to FIG. 15, sense amplifier SA#0 according to the third embodiment of the present invention differs from sense amplifier SA0 shown in FIG. 6 in that transistors QP5 and QV2 are eliminated. It also differs in that transistor QP6 receives reference voltage VDref from VDref generation circuit 45. It further differs in that voltage supply unit 90 is shared by sense amplifiers SA#0, SA#1 and VDref generation circuit 45. The other components, which have the same configuration as in sense amplifier SA0 of FIG. 6 described in the first embodiment, and its description will not be therefore repeated.

Figure 16:
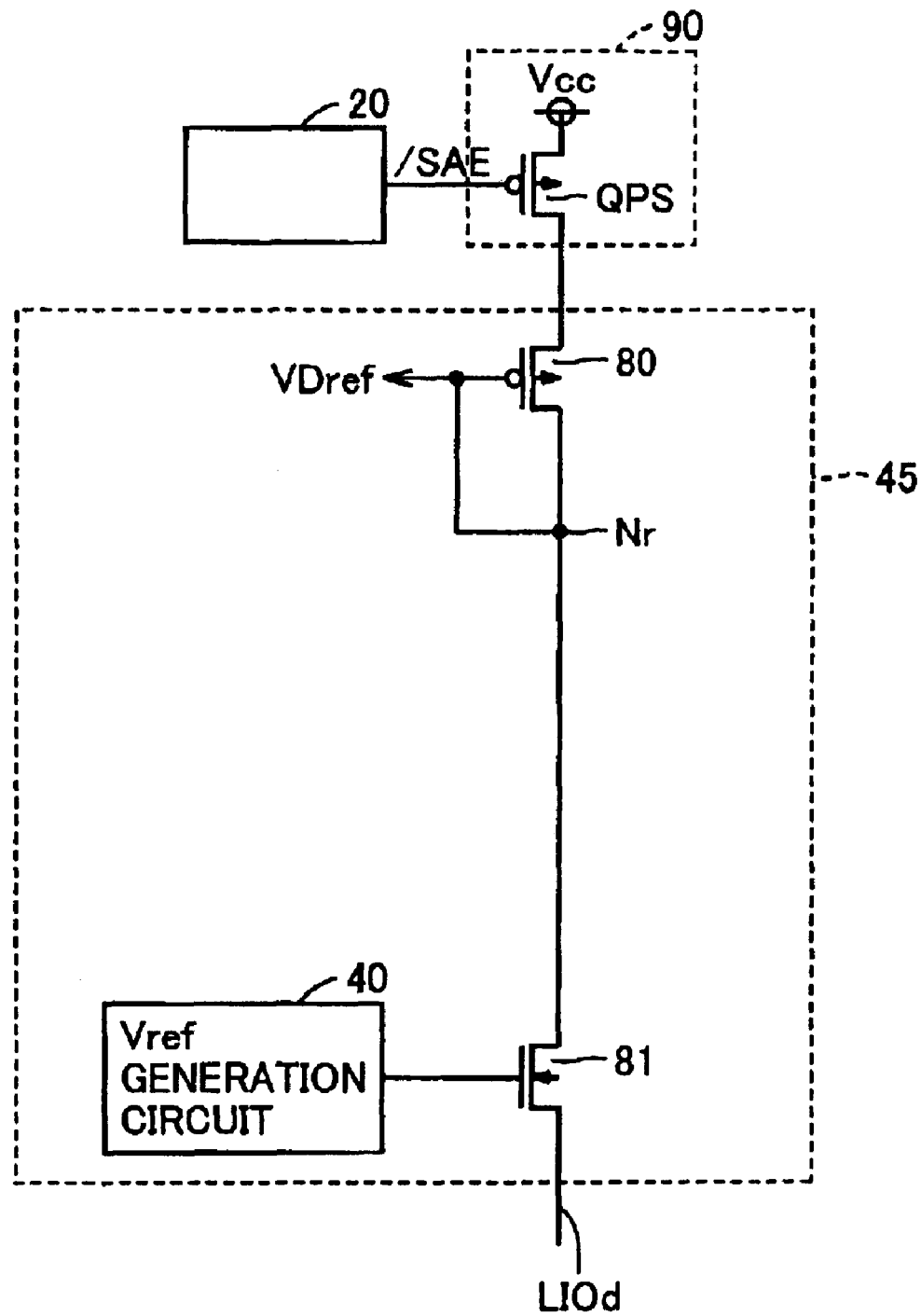
FIG. 16 is a circuit configuration diagram showing a VDref generation circuit and peripheral circuits.

As shown in FIG. 16, VDref generation circuit 45 includes transistors 80 and 81. Transistor 80.is arranged between voltage supply unit 90 and a node Nr and its gate is electrically coupled to node Nr. Transistor 81 is arranged between node Nr and local I/O line LIOd and its gate receives reference voltage Vref from Vref generation circuit 40. Voltage supply unit 90 supplies power supply voltage Vcc in response to control signal /SAE from row decoder 20. As an example, a P-channel MOS transistor is used as transistor 80, and a N-channel MOS transistor is used as transistor 81.

VDref generation circuit 45 is supplied with operating voltage Vcc from voltage supply unit 90 so as to form a current path with dummy memory cell DMC connected with local I/O line LIOd. Thus the predetermined passing current according to the resistance value of the dummy memory cell is supplied from transistor 80. Reference voltage VDref according to the predetermined passing current is generated in node Nr.

VDref generation circuit 45 supplies reference voltage VDref generated, to sense amplifiers SA#0 and SA#1.

As a result, in sense amplifier SA#0, the same amount of operating current as the predetermined passing current which flows through transistor 80 is supplied from transistors QP6 and QP7. In other words, VDref generation circuit 45 corresponds to a circuit which is equivalent to the circuit formed of transistors QP5 and QV2 shown in FIG. 6 according to the first embodiment.

Therefore, the same amplifying operation as is described in the first embodiment can be performed by sense amplifiers SA#0 and SA#1. To be more specific, the passing current difference between local I/O lines LIO0 and LIOd is amplified and converted into a voltage difference by sense nodes SN and /SN.

Sense amplifier SA#1, which has the same configuration as sense amplifier SA#0, receives reference voltage VDref from VDref generation circuit 45 so as to perform an amplifying operation according to the passing current difference between local I/O lines LIO1 and LIOd.

Preamplifiers PA0a and PA0b, which have the same configuration as preamplifier PA0 shown in FIG. 7 described in the first embodiment, are not described again. Latch circuits LT0 and LT1, which have the same configuration as latch circuit LT shown in FIG. 8 described in the first embodiment, are not described again.

Figure 17:
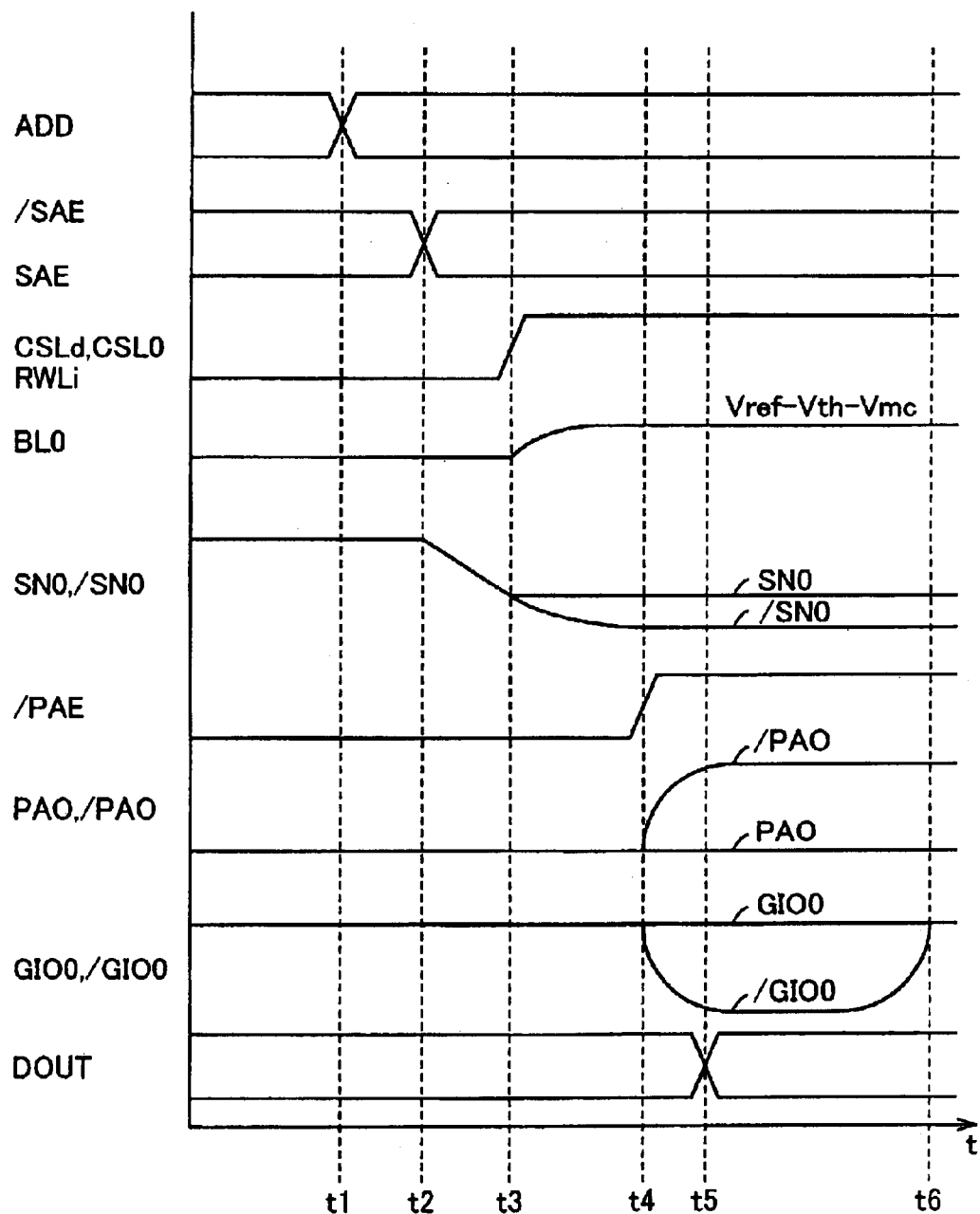
FIG. 17 is a timing chart for describing a data read operation of a memory array according to the third embodiment of the present invention.

Next, a description will be given of a data read operation of memory array MA#0 according to the third embodiment of the present invention, with reference to the timing chart of FIG. 17. First, 1-bit data reading of the selected memory cell corresponding to bit line BL0 of memory array MA#0 will be described.

At time t1, address ADD effective to perform a data read operation is inputted. As a result, memory array MA#0 is selected, and at time t2 control signals SAE and /SAE for activating sense amplifier SA0 corresponding to selected memory array MA#0 are set at "H" level and "L" level, respectively. Consequently, sense amplifier SA0 is activated, and sense nodes SN and /SN of sense amplifier SA#0 start to make a transition to the predetermined intermediate potential between power supply voltage Vcc and ground voltages GND. This causes sense amplifier SA#0 to perform a preparing operation for an amplifying operation.

At time t3, column selection lines CSL0 and CSLd, word line RWLi which are selected in correspondence with address ADD inputted are activated ("H" level). In response to the activation of selected column selection lines CSL0, and CSLd, bit line BL0 of the selected column and local I/O line LIO0 are electrically coupled to each other. Also, bit line BLd and local I/O line LIOd are electrically coupled to each other. In response to the activation of the selected word line RWLi, local I/O line LIO0 is pulled down to ground voltage GND through bit line BL0 and the selected memory cell MC. In response to the activation of word line RWLi selected, local I/O line LIOd is pulled down to ground voltage GND through bit line BL0 and dummy memory cell DMC. In response to control signal /SAE ("L" level), current paths are formed between sense amplifier SA#0 and VDref generation circuit and between the selected memory cell MC and dummy memory cell DMC, thereby performing the same predetermined sensing operation as above in sense amplifier SA#0. Column selection gates CSG# and CSGr, column selection lines CSL0 and CSLd, and column decoder 25 form an address selection unit.

Operations on and after time t3, which are the same as those described with reference to FIG. 9 according to the first embodiment, will not be described again. With regard to the selected memory cell MC1 provided in correspondence with bit line BL1 at the same timing, the same amplifying operation is performed in sense amplifier SA#1 in response to the activation of column selection line CSL0, so as to output storage data from output buffer OBF# as output data DOUT. Thus the configuration according to the third embodiment of the present invention enables 2-bit output data DOUT to be outputted outside in one data read operation.

Although 2-bit data read operation has been described as above, reading of more bit data can be performed in one data read operation.

To be more specific, the plurality of bit lines BL are divided into a plurality of groups, and column selection lines are provided and accessed in correspondence with the plurality of groups. Providing local I/O lines LIO, sense amplifiers, preamplifiers, global I/O line pairs, latch circuits and the like according to the number of the bit lines belonging to each group makes it possible to perform the same data read operation as that described in the present embodiment.

The configuration of the data reading circuits according to the third embodiment can realize a speedup in a data read operation by performing parallel data reading and reduce the number of column selection lines CSL.

Providing a single bit line BLd in correspondence with the dummy memory cell used to compare with the selected memory cell can reduce the size of the memory arrays.

Sharing voltage supply unit 90 can reduce the number of the components in the circuits. In addition, supplying reference voltage VDref to each sense amplifier SA# can reduce the number of the components in each sense amplifier SA#.

Fourth Embodiment

In a fourth embodiment of the present invention, a description will be given of the configuration for performing data reading without providing a dummy memory cell to compare with the selected memory cell inside the memory arrays.

Figure 18:
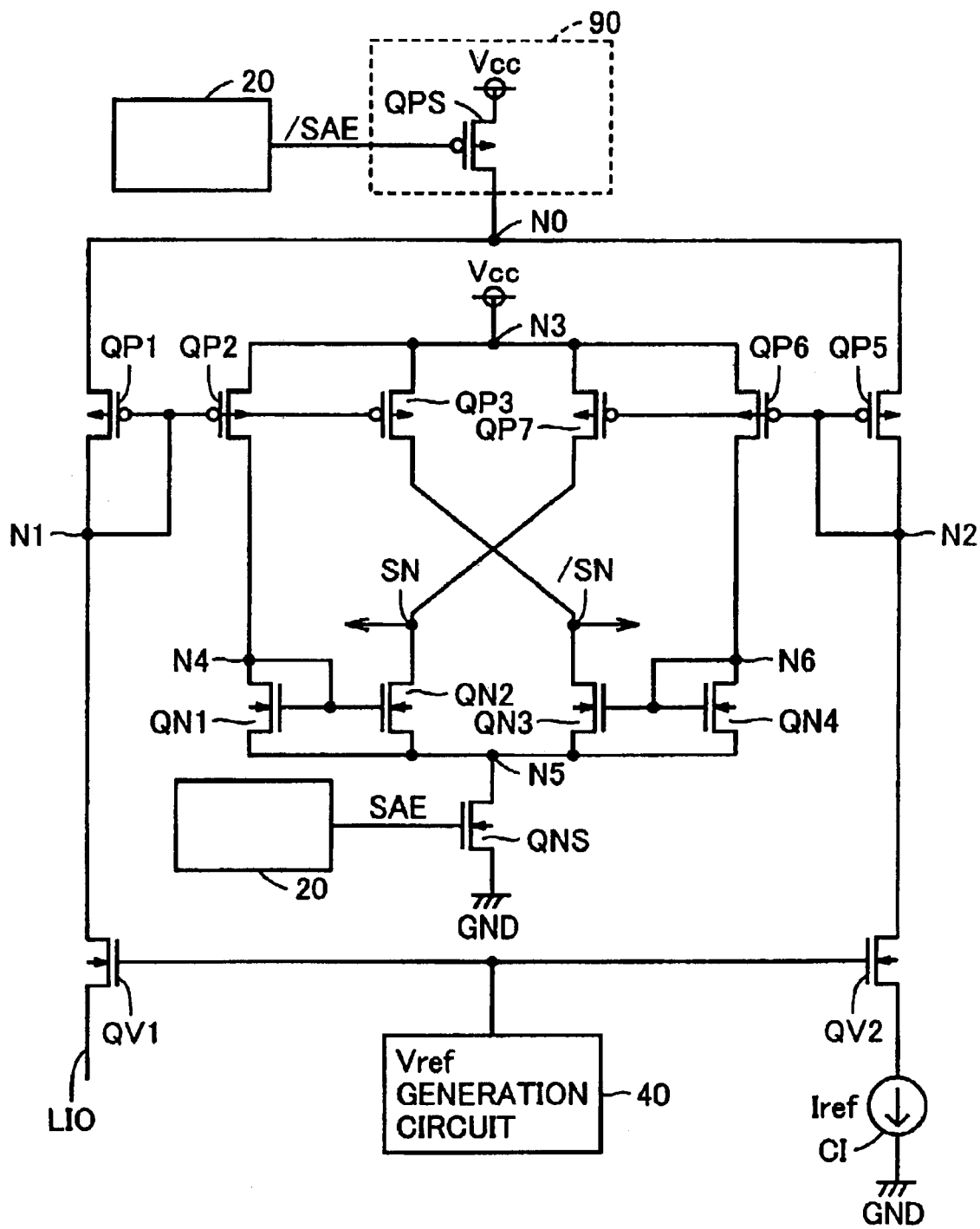
FIG. 18 is a circuit configuration diagram showing a sense amplifier according to a fourth embodiment of the present invention.

With reference to FIG. 18, the sense amplifiers SAP according to the fourth embodiment of the present invention differ from sense amplifiers SA shown in FIG. 6 described in the first embodiment in that transistor QV2 is electrically coupled to predetermined current power supply CI. Predetermined current power supply CI supplies a reference current Iref steadily. With this configuration, it is possible to realize supplying transistor QP5 with reference current Iref without using dummy memory cell DMC, and easily performing a data read operation without using dummy memory cell DMC.

In the fourth embodiment, the parasitic capacity on the predetermined current power supply CI side is small, and so a parasitic capacity is added only to local I/O lines LIO and the like connected to memory cells MC.

In the configuration according to the fourth embodiment of the present invention, control signal /SAE is activated earlier than control signal SAE as described in the second embodiment.

Similar to the second embodiment, the operating current inside sense amplifiers SAP is supplied at the same timing as a passing current difference is caused between local I/O lines LIO and predetermined current power supply CI side, thereby performing an amplifying operation.

In the case where control signals SAE and /SAE are activated at the same timing, a large parasitic capacity is added on local I/O lines LIO side, which results in the transient formation of an excessive current path. This may cause a transient voltage difference opposite to the storage data to sense nodes SN and /SN, thereby impeding a high-rate amplifying operation.

Thus activating the control signals at different timings can suppress the transient formation of an excessive current path, thereby realizing a high-rate amplifying operation.

Fifth Embodiment

In the above embodiments, description has been given of the configuration provided with transistors QV1 and QV2 for receiving reference voltage Vref by the respective gates from Vref generation circuit 40, thereby controlling the voltage level of local I/O lines LIO so as not to apply a voltage more than the predetermined level on memory cells MC.

In a fifth embodiment the present invention, a description will be given of a configuration to eliminate transistors QV1 and QV2 while controlling the level of the voltage to be applied to memory cells MC.

Figure 19:
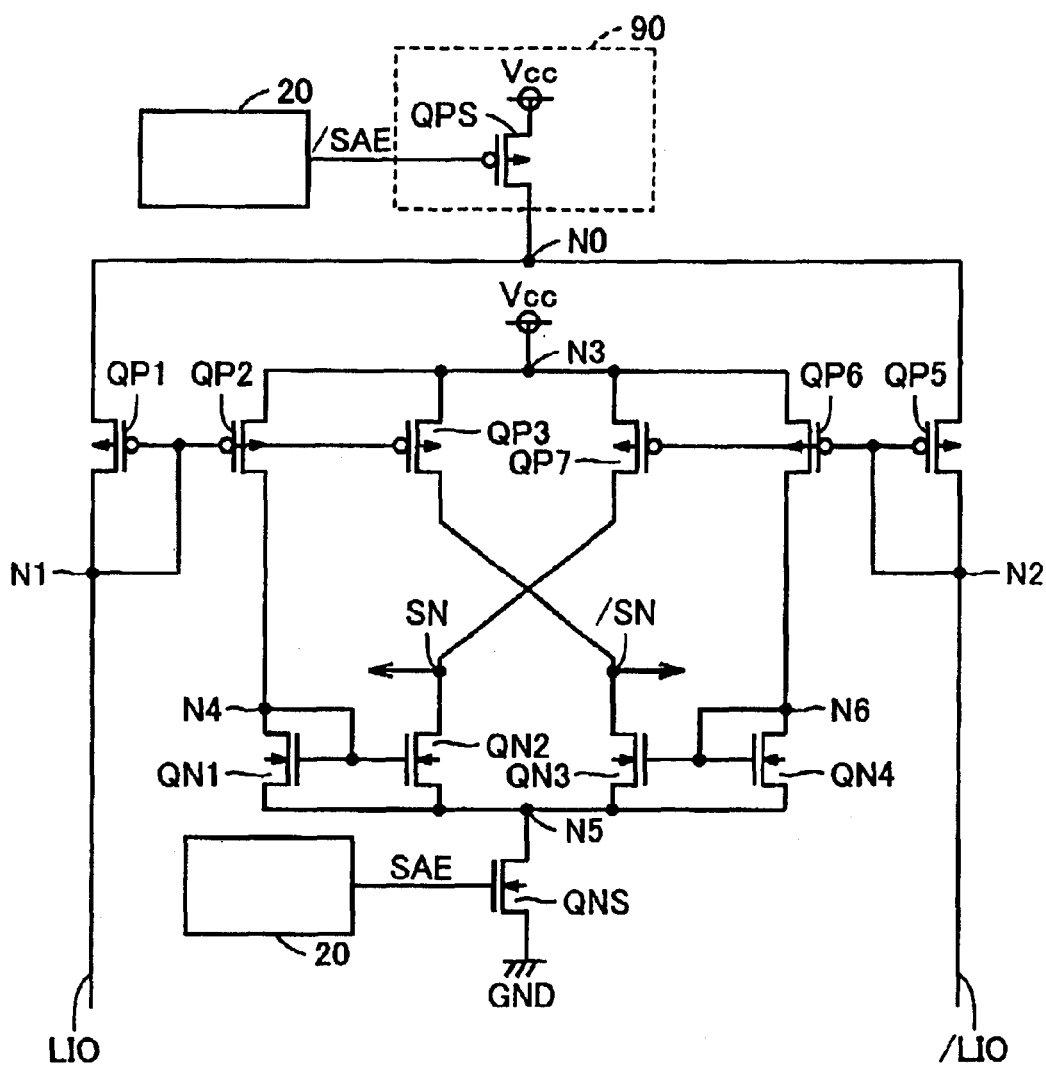
FIG. 19 is a circuit configuration diagram showing a sense amplifier according to a fifth embodiment of the present invention.

With reference to FIG. 19, sense amplifier SAP# according to the fifth embodiment of the present invention differs from sense amplifier SA shown in FIG. 6 in that transistors QV1, QV2, and Vref generation circuit 40 are eliminated. The other components are the same and will not be described again.

In sense amplifier SAP#, the elimination of transistors QV1 and QV2 brings node N1 into a direct electrical connection with the selected memory cell MC through the local I/O lines and the gate transistors. Consequently, the voltage to be applied on the memory cell is determined by the ratio between the on resistance of transistor QP1 and the electric resistance (on resistance) of memory cell MC. For example, when the on resistance of transistor QP1 is 8 kΩ and the electric resistance of the memory cell is 2 kΩ, the voltage to be applied on the memory cell is equal to a power supply voltage Vcc−8/10×Vcc. Making use of the on resistance of transistor QP1 can adjust the voltage to be applied on the memory cell.

In the present embodiment, the set parameters of transistors QP1 and QP5 are adjusted so as to control the voltage to be applied to the memory cell. To be more specific, the on resistance of transistors QP1 and QP5 is set at a higher value than the electric resistance of the memory cell MC. For example, the on resistance of transistors QP1 and QP5 can have a larger value than the on resistance of the access transistor of the memory cell MC.

This enables the voltage applied to the selected memory cell to be set at the predetermined voltage level or less, which achieves the same data read operation as described in the first embodiment, without memory cell breakage.

Since the application voltage of memory cell MC can be adjusted by using transistors QP1 and QP5, the provision of the Vref generation circuit becomes unnecessary, thereby reducing the number of components in the circuits.

Sixth Embodiment

In the above embodiments, the description has been given of a nonvolatile memory device using tunneling magnetoresistance elements which are nonvolatile memory elements. In the present embodiment, a description will be given of an application of the present embodiment using other nonvolatile memory elements.

Figure 20A:
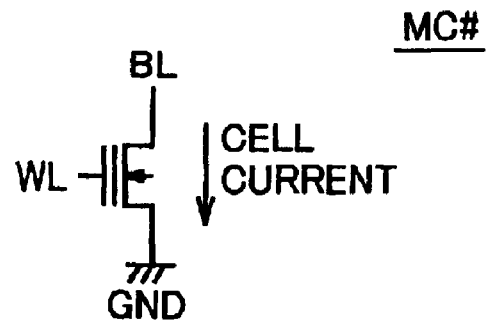
FIGS. 20A, 20B and 20C are conceptual diagrams showing a memory cells which can be replaced with the memory cell according to the first embodiment.

As shown in FIG. 20A, a flash memory which is a nonvolatile memory element is used as memory cell MC#.

In this case, memory cell MC# is arranged between bit line BL and ground voltage GND and its gate is electrically connected to word line WL.

For data writing, word line WL and bit line BL are applied with a high voltage, and hot electrons are injected to a floating gate of the flash memory. As a result, threshold voltage Vth of the flash memory increases. Binary storage data are stored based on the level of threshold voltage Vth. On the other hand, data reading can be performed by detecting a passing current which flows through memory cell MC# according to threshold voltage Vth.

Figure 20B:
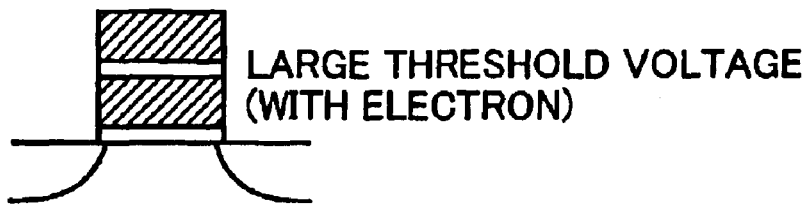
Figure 20C:
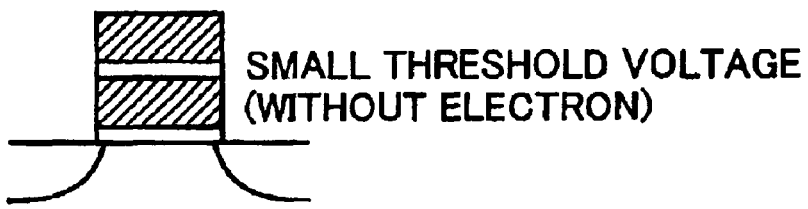

With reference to FIGS. 20B and 20C, memory cell MC where data writing has been performed will be described as follows.

As shown in FIG. 20B, the electron injection increases threshold voltage Vth, which leads to a decrease in the passing current.

As shown in FIG. 20C, threshold voltage Vth is set low when no electron is injected, which leads to an increase in the passing current.

Therefore, the difference between the passing current which flows through memory cell MC# and the reference current generated based on the dummy memory cell or the like is converted into a voltage difference amplified by sense amplifier SA0. This can perform the same data read operation as in the first embodiment.

Modification of Sixth Embodiment

In the sixth embodiment, the description has been given of the application of the flash memory. In a modification of the sixth embodiment, a description will be given of the application of OUM(R).

Figure 21A:
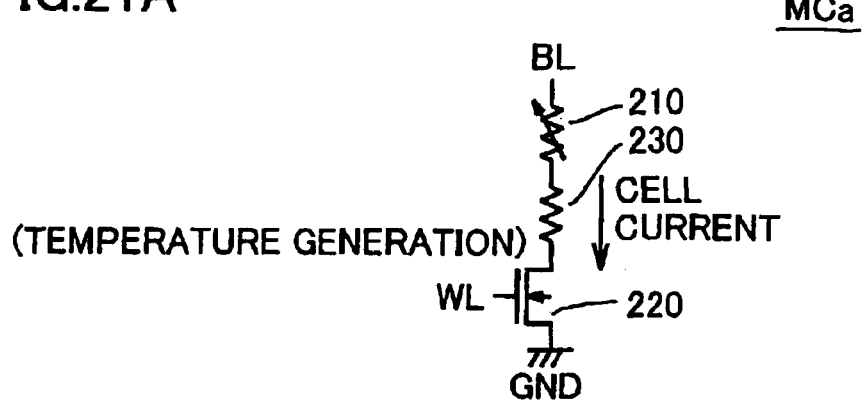
FIGS. 21A, 21B and 21C are conceptual diagrams showing another memory cell which can be replaced with the memory cell according to the first embodiment.

As shown in FIG. 21A, OUM(R) which is a nonvolatile memory element is used as a memory cell MCa.

In this case, memory cell MCa has a chalcogenide layer 210 which is a phase-change element connected in series between bit line BL and ground voltage GND, and a switching transistor 220. Between chalcogenide layer 210 and switching transistor 220 is arranged a heating element 230 which generates heat by a passing current. The gate of switching transistor 220 is connected to word line WL.

At the time of data writing, switching transistor 220 is turned on, and a data writing current is flown from bit line BL to chalcogenide layer 210 and heating element 230. According to the pattern of supplying the data writing current (the time period and amount to be supplied, for example), chalcogenide layer 210 phase-changes into either a crystallized state or an amorphous state. Chalcogenide layer 210 changes its electric resistance between the amorphous state and the crystallized state. To be more specific, the chalcogenide layer in the amorphous state has an electric resistance higher than in the crystallized state.

Therefore, at the time of data reading, switching transistor 220 can be turned on and the data reading current which does not reach a phase change can be made to flow through chalcogenide layer 210 to perform the same data reading as in MTJ cell, based on the electric resistance difference.

Figure 21B:
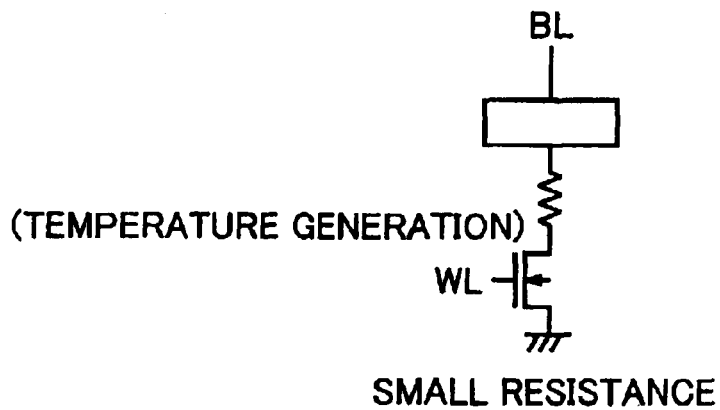

As shown in FIG. 21B, when chalcogenide layer 210 is in a crystallized state, the electric resistance value is small, which results in an increase in the passing current.

Figure 21C:
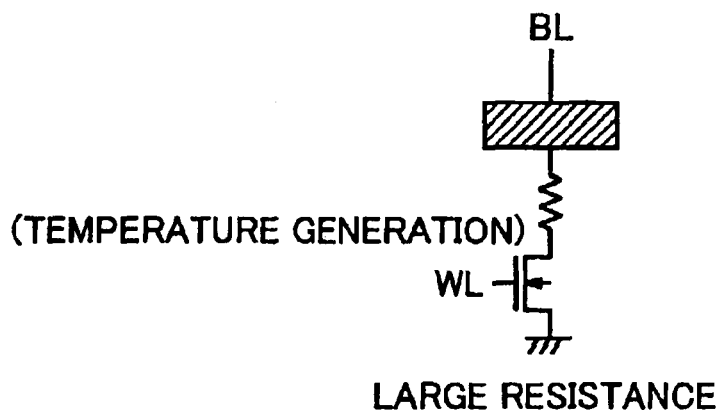

As shown in FIG. 21C, when chalcogenide layer 210 is in an amorphous state, the electric resistance value is large, which results in a decrease in the passing current.

Thus the same data read operation as in the first embodiment can be performed by converting the passing current difference between the passing current which flows through memory cell MCa and the reference current generated based on the dummy cell and the like into a voltage difference amplified by sense amplifier SA0.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device comprising:
   a plurality of memory cells through which a passing current flows according to stored data at the time of data reading;
   a first and second data lines;
   a differential amplifying unit for performing data reading in accordance with a passing current difference between said first and second data lines; and
   a reference voltage supply unit for generating a passing current to be used to compare with a selected memory cell out of said plurality of memory cells in one of said first and second data lines at the time of said data reading, wherein
   at the time of said data reading, one of said first and second data lines is electrically connected to a first voltage through said selected memory cell, and the other of said first and second data lines is electrically connected to said reference current supply unit, and
   said differential amplifying unit includes:
   a first current mirror circuit arranged between said one data line and a second voltage so as to maintain the voltage of said one data line at a predetermined level at the time of said data reading, and to supply a first mirror current according to the passing current of said one data line, to a first internal node;

a second current mirror circuit arranged between said other data line and said second voltage so as to maintain the voltage of said other data line at said predetermined level at the time of said data reading, and to supply a second mirror current according to the passing current of said other data line, to a second internal node; and an amplifying unit for outputting read data according to the difference between the mirror currents to be supplied to said first and second internal nodes at the time of said data reading.

2. The nonvolatile memory device according to claim 1, wherein said amplifying unit includes:

a first current supply unit provided in correspondence with said first internal node so as to supply said first mirror current to a first output node arranged between said second voltage and a third voltage and also to feed said second mirror current at the time of said data reading; and a second current supply unit provided in correspondence with said second internal node so as to supply said second mirror current to a second output node arranged between said second voltage and said third voltage and also to draw out said first mirror current at the time of said data reading.

3. The nonvolatile memory device according to claim 2, further comprising:

a signal generation circuit provided in correspondence with said first and second output nodes so as to generate a first and second complementary signals according to the voltages of said first and second output nodes, respectively;

first and second I/O lines which are precharged to one of said first and second voltages before data reading; and a connection control unit which connects one of said first and second I/O lines to the other of said first and second voltages in response to the input of said first and second signals at the time of said data reading.

4. The nonvolatile memory device according to claim 3, further comprising:

a read data generation circuit connected to said first and second I/O lines so as to generate read data according to the voltages of said first and second I/O lines at the time of said data reading.

5. The nonvolatile memory device according to claim 1, wherein said first and second current mirror circuits set said predetermined voltage between said first and second voltages.

6. The nonvolatile memory device according to claim 5, further comprising:

a reference voltage generation circuit for generating a reference voltage, wherein said first current mirror circuit includes a first field effect transistor arranged between said second voltage and said one data line so as to receive said reference voltage at a gate thereof; and said second current mirror circuit includes a second field effect transistor arranged between said second voltage and said other data line so as to receive said reference voltage at a gate thereof.

7. The nonvolatile memory device according to claim 1, wherein said plurality of memory cells are arranged in a matrix, said nonvolatile memory device further comprises a plurality of word lines provided in correspondence with memory cell rows, said reference current supply unit includes a plurality of comparative memory cells each of which is to be compared with said selected memory cell at the time of said data reading, each of said comparative memory cells is aligned in a row direction so as to share a column of memory cells among said plurality of memory cells, and said nonvolatile memory device further comprises an address selection unit for electrically connecting said selected memory cell and said one data line and also electrically connecting one of said plurality of comparative memory cells and said other data line, in response to the activation of the word line of the selected row at the time of said data reading.

8. The nonvolatile memory device according to claim 1, wherein said plurality of memory cells are arranged in the matrix, said nonvolatile memory device further comprises a plurality of first bit lines provided in correspondence with memory cell columns, respectively, said reference current supply unit includes a plurality of comparative memory cells each of which is to be compared with said selected memory cell at the time of said data reading;

each of said plurality of comparative cells is aligned in a column direction so as to share a row of memory cells among said plurality of memory cells, said nonvolatile memory device further comprises:

a plurality of second bit lines which are provided in correspondence with memory cell columns, respectively and which are complementary with said plurality of first bit lines; and an address selection unit for connecting one and the other of the first bit line and the second bit line corresponding to a selected column to said selected memory cell and one of said plurality of dummy memory cells, respectively, at the time of said data reading.

9. The nonvolatile memory device according to claim 1, wherein said first and second current mirror circuits are activated by a first activating signal, said amplifying unit is activated by a second activating signal, and at the time of said data reading, said first and second activating signals are inputted at different timings.

10. The nonvolatile memory device according to claim 1, wherein said reference current generation unit includes a predetermined current supply circuit which steadily supplies said passing current to said other data line.

11. The nonvolatile memory device according to claim 1, wherein said first current mirror circuit has a first field effect transistor which is arranged between said second voltage and said one data line and which has a gate connected to said one data line, said second current mirror circuit has a second field effect transistor which is arranged between said second voltage and said other data line and which has a gate connected to said other data line, and said first and second field effect transistors have a set parameter which provides predetermined effects.

12. A nonvolatile memory device comprising:

a plurality of memory cells arranged in a matrix through which a passing current flows according to stored data at the time of data reading;

a plurality of bit lines provided in correspondence with memory cell columns, respectively;

X (X: an integer of equal to or more than 2) data lines;

a reference data line used to compare with a selected memory cell out of said plurality of memory cells at the time of said data reading;

a reference current supply unit for generating a predetermined passing current to said reference data line at the time of said data reading;

X differential amplifying units provided in correspondence with said X data lines, respectively so as to perform data reading according to the difference between the passing currents which flow through the corresponding data lines and said reference data line, said plurality of bit lines being divided into a plurality of groups each having X bit lines at the time of said data reading;

a plurality of column selection lines provided in correspondence with said plurality of groups, respectively; and a plurality of connection control units provided in correspondence with said plurality of groups so as to electrically couple X bit lines belonging to the corresponding group, respectively to said X data lines, in response to the activation of the corresponding column selection line at the time of said data reading, wherein at least one of said X bit lines is electrically connected to a first voltage through said selected memory cell at the time of said data reading, and each of said X differential amplifying units includes:

a current mirror circuit arranged between the corresponding data line and a second voltage so as to maintain the voltage of said corresponding data line at a predetermined level at the time of said data reading, and to supply a mirror current according to the passing current of said corresponding data line, to an internal node; and an amplifying unit for outputting read data according to the current difference between said passing current which flows through said reference data line and said mirror current to be supplied to said internal node, at the time of said data reading.

* * * * *